US012745470B2

(12) United States Patent
Kurihara

(10) Patent No.: US 12,745,470 B2
(45) Date of Patent: Sep. 22, 2026

(54) IMAGING DEVICE AND ELECTRONIC APPARATUS

(71) Applicant: Sony Semiconductor Solutions Corporation, Kanagawa (JP)

(72) Inventor: Shinichiro Kurihara, Tokyo (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 463 days.

(21) Appl. No.: 18/554,893

(22) PCT Filed: Mar. 29, 2022

(86) PCT No.: PCT/JP2022/015472
§ 371 (c)(1),
(2) Date: Oct. 11, 2023

(87) PCT Pub. No.: WO2022/249734
PCT Pub. Date: Dec. 1, 2022

(65) Prior Publication Data

US 2024/0120356 A1 Apr. 11, 2024

(30) Foreign Application Priority Data

May 28, 2021 (JP) ................................ 2021-090081

(51) Int. Cl.
*H01L 27/146* (2006.01)
*H10F 39/00* (2025.01)
*H10F 39/18* (2025.01)

(52) U.S. Cl.
CPC ....... *H10F 39/8057* (2025.01); *H10F 39/182* (2025.01)

(58) Field of Classification Search
CPC .......................... H10F 39/8057; H10F 39/182
See application file for complete search history.

(56) References Cited

U.S. PATENT DOCUMENTS

2016/0211304 A1* 7/2016 Okazaki .............. H10F 39/8063
2016/0269668 A1* 9/2016 Oshiyama ............ H10F 77/244
(Continued)

FOREIGN PATENT DOCUMENTS

JP S62122268 A 6/1987
JP 2006261638 A 9/2006
(Continued)

OTHER PUBLICATIONS

International Search Report (PCT/ISA/210), International Application No. PCT/JP2022/015472, dated Jul. 5, 2022.

*Primary Examiner* — William C Trapanese
(74) *Attorney, Agent, or Firm* — Michael Best & Friedrich LLP

(57) ABSTRACT

[Problem] To provide an imaging device capable of suppressing color mixing and an electronic apparatus using the imaging device.

[Solution] An imaging device of the present disclosure includes a photoelectric conversion layer disposed on a semiconductor substrate, a transparent electrode layer disposed on the photoelectric conversion layer, a first light-shielding portion that separates the photoelectric conversion layer into a plurality of pixels arranged in a first direction and a second direction that intersects the first direction, and is disposed along a boundary between the separated pixels, and a second light-shielding portion disposed along the boundary between the separated pixels inside the transparent electrode layer and disposed so that a portion of the boundary between adjacent pixels is interrupted.

20 Claims, 22 Drawing Sheets

(56) References Cited

U.S. PATENT DOCUMENTS

| | | | | |
|---|---|---|---|---|
| 2017/0148829 | A1* | 5/2017 | Tanaka | H10F 39/807 |
| 2019/0157323 | A1* | 5/2019 | Ogi | H10F 39/199 |
| 2020/0028017 | A1* | 1/2020 | Imoto | G01S 7/4816 |

FOREIGN PATENT DOCUMENTS

| | | | |
|---|---|---|---|
| JP | 2013065688 | A | 4/2013 |
| JP | 2017038011 | A | 2/2017 |
| JP | 2017112376 | A | 6/2017 |
| WO | 2017159361 | A1 | 9/2017 |
| WO | 2018016181 | A1 | 1/2018 |

* cited by examiner

IMAGING DEVICE AND ELECTRONIC APPARATUS

TECHNICAL FIELD

Embodiments of the present disclosure relate to an imaging device and an electronic apparatus.

Background Art

An imaging device having a transparent electrode and a photoelectric conversion layer is known. This imaging device becomes an organic sensor when the photoelectric conversion layer contains an organic photoelectric conversion material, and becomes an InGaAs sensor when the photoelectric conversion layer contains a compound semiconductor (for example, InGaAs) (see PTL 1 and PTL 2). In these imaging devices, in order to ensure the conductivity of the transparent electrode, trenches for partitioning pixels are formed under the transparent electrode, and the trenches are filled with a light-shielding member. If a trench is formed up to the top of the transparent electrode and a light-shielding portion is formed by filling this trench with a light-shielding member, the transparent electrode will also be divided corresponding to the pixels, and wiring will be required to connect to each pixel. Placing these wirings is not practical in terms of realizing a layout.

CITATION LIST

Patent Literature

[PTL 1]
JP 2017-112376A
[PTL 2]
JP 2017-038011A

SUMMARY

Technical Problem

For this reason, in the imaging device described in PTL 1 or PTL 2, since a light-shielding portion is not provided in the boundary region of pixels in the transparent electrode, there is a problem that color mixing occurs due to oblique light transmitted through the transparent electrode.

The present disclosure provides an imaging device that can suppress color mixing and an electronic apparatus using this imaging device.

Solution to Problem

An imaging device according to a first aspect of the present disclosure includes a photoelectric conversion layer disposed on a semiconductor substrate; a transparent electrode layer disposed on the photoelectric conversion layer; a first light-shielding portion that separates the photoelectric conversion layer into a plurality of pixels arranged in a first direction and a second direction that intersects the first direction, and is disposed along a boundary between the separated pixels; and a second light-shielding portion disposed along the boundary between the separated pixels inside the transparent electrode layer and disposed so that a portion of the boundary between adjacent pixels is interrupted.

In the imaging device according to the first aspect, the second light-shielding portion may be disposed so that a portion of the boundary between the pixels arranged along the first direction in the transparent electrode layer is interrupted, and the pixels arranged along the second direction are separated from each other.

In the imaging device according to the first aspect, the second light-shielding portion may be disposed so that a portion of the boundary between the pixels arranged along the first direction in the transparent electrode layer is interrupted, and a portion of the boundary between the pixels arranged along the second direction is interrupted.

The imaging device according to the first aspect may further include protective layer disposed on the transparent electrode layer, and the second light-shielding portion may be disposed to penetrate the protective layer and the transparent electrode layer from an upper surface of the protective layer.

The imaging device according to the first aspect may further include a third light-shielding portion provided on the protective layer and connected to the second light-shielding portion, and the third light-shielding portion is disposed in a lattice pattern along the boundary between the pixels.

In the imaging device according to the first aspect, the first light-shielding portion and the second light-shielding portion may be separated in a stacking direction.

The imaging device according to the first aspect may further include a protective layer disposed on the transparent electrode layer, and the second light-shielding portion is disposed inside the transparent electrode layer so as to penetrate the protective layer from the upper surface of the protective layer and not penetrate the transparent electrode layer.

The imaging device according to the first aspect may further include a third light-shielding portion provided on the protective layer and connected to the second light-shielding portion, and the third light-shielding portion may be disposed in a lattice pattern along the boundary between the pixels.

The imaging device according to the first aspect may further include a wiring stacked structure provided between the semiconductor substrate and the photoelectric conversion layer, and the first light-shielding portion may be electrically connected to the wiring stacked structure.

In the imaging device according to the first aspect, the first light-shielding portion may include an electrode penetrating from the upper surface to the lower surface of the photoelectric conversion layer, and the electrode may be electrically connected to the wiring stacked structure.

In the imaging device according to the first aspect, the first light-shielding portion may be disposed to surround a side portion of the pixel.

In the imaging device according to the first aspect, the second light-shielding portion may be disposed to penetrate the transparent electrode layer, and side portions and end portions of the second light-shielding portion may be covered with an insulating film.

In the imaging device according to the first aspect, the first light-shielding portion and the second light-shielding portion may be connected in a stacking direction.

The imaging device according to the first aspect may further include a protective layer disposed on the transparent electrode layer, the second light-shielding portion may penetrate the protective layer and the transparent electrode layer from the upper surface of the protective layer and has side portions covered with an insulating film, the first light-shielding portion may penetrate the photoelectric conversion layer, and side portions and end portions of the second light-shielding portion may be covered with an insulating film.

In the imaging device according to the first aspect, a cross-sectional area of the end portions of the first light-shielding portion may be smaller than a cross-sectional area of other portions.

In the imaging device according to the first aspect, a cross-sectional area of the end portions of the first light-shielding portion may be larger than a cross-sectional area of other portions.

The imaging device according to the first aspect may further include a protective layer disposed on the transparent electrode, and a third light-shielding portion provided on the protective layer and connected to the second light-shielding portion.

In the imaging device according to the first aspect, the first light-shielding portion and the second light-shielding portion may be disposed so as to at least partially overlap when viewed in a plan view.

The imaging device according to the first aspect may further include a first wiring that supplies a ground potential to the transparent electrode layer; and a second wiring that supplies a negative bias potential to the second light-shielding portion.

An electronic apparatus according to a second aspect includes an imaging device; and a signal processing unit that performs signal processing based on pixel signals captured by the imaging device, wherein the imaging device includes: a photoelectric conversion layer disposed on a semiconductor substrate; a transparent electrode layer disposed on the photoelectric conversion layer; a first light-shielding portion that separates the photoelectric conversion layer into a plurality of pixels arranged in a first direction and a second direction that intersects the first direction, and is disposed along a boundary between the separated pixels; and a second light-shielding portion disposed along the boundary between the separated pixels inside the transparent electrode layer and disposed so that a portion of the boundary between adjacent pixels is interrupted.

DESCRIPTION OF EMBODIMENTS

Figure 1:
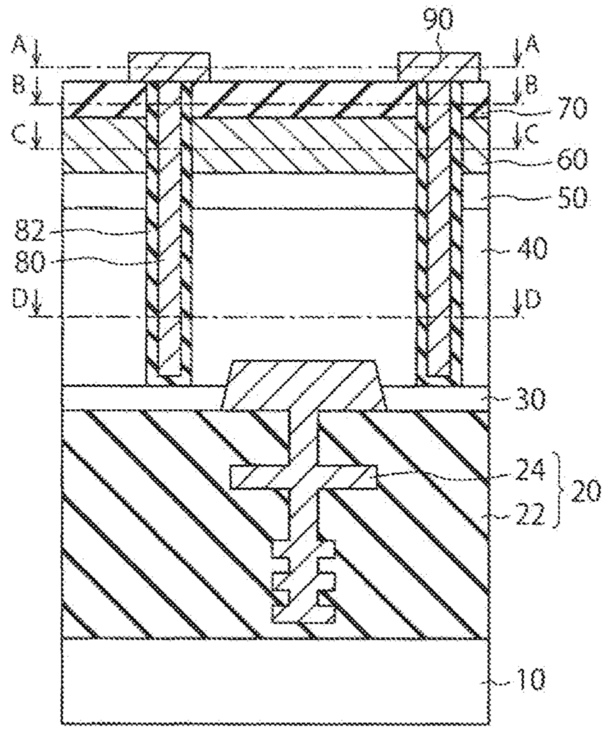
FIG. 1 is a cross-sectional view showing an imaging device according to a first embodiment.

Embodiments of the present disclosure will be described with reference to the accompanying drawings. Although the components of the imaging device and the electronic apparatus will be mainly described, in the following embodiments, the imaging device and the electronic apparatus may include components and functions that are not illustrated or explained. The following description does not exclude components or functions that are not illustrated or described.

In addition, the drawings referred to in the following description are drawings for explaining the embodiments of the present disclosure and promoting understanding thereof, and for the sake of clarity, the shapes, dimensions, ratios, and the like shown in the drawings may differ from the actual ones.

First Embodiment

FIG. 1 shows a cross-sectional view of an imaging device according to the first embodiment. The imaging device of the first embodiment includes a semiconductor substrate 10, a wiring stacked structure 20 disposed on the semiconductor substrate 10, a buffer layer 30 disposed on the wiring stacked structure 20, a photoelectric conversion layer 40 disposed on the buffer layer 30, a buffer layer 50 disposed on the photoelectric conversion layer 40, a transparent electrode layer 60 disposed on the buffer layer 50, and a protective layer 70 (is posed on the transparent electrode layer 60.

The semiconductor substrate 10 contains a semiconductor (for example, silicon). The wiring stacked structure 20 has a structure in which a wiring layer 24 is stacked on an insulating film 22. The photoelectric conversion layer 40 converts incident light through the protective layer 70, the transparent electrode layer 60, and the buffer layer 50 into electrical signals. The imaging device of the present embodiment becomes an InGaAs sensor when the photoelectric conversion layer 40 contains a compound semiconductor (for example, InGaAs), and the imaging device of the present embodiment becomes an organic sensor when the photoelectric conversion layer 40 is an organic photoelectric conversion layer. When the photoelectric conversion layer 40 contains a compound semiconductor, the buffer layer 30 disposed between the photoelectric conversion layer 40 and the wiring stacked structure 20 serves as a seed substrate for producing the compound semiconductor. The transparent electrode layer 60 is an electrode containing a material that transmits light, such as ITO (Indium Tin Oxide). The protective layer 70 is made of a light-transmitting inorganic material such as silicon oxides, silicon nitrides, or silicon oxynitrides.

The imaging device of the present embodiment further includes a light-shielding member 80 that penetrates the protective layer 70, the transparent electrode layer 60, the buffer layer 50, and the photoelectric conversion layer 40 in the stacking direction and reaches the buffer layer 30, and an insulating film 82 that covers the side surfaces and the bottom surface of the light-shielding member 80. The light-shielding member 80 constitutes a pixel-region-partitioning portion and also forms a portion of an inter-pixel light-shielding portion.

Figure 2A:
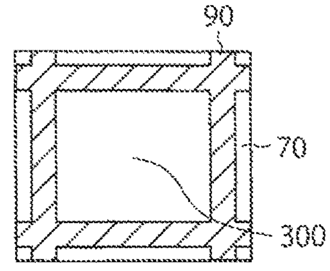
FIG. 2A is a cross-sectional view taken along the cutting plane A-A shown in FIG. 1.
Figure 2B:
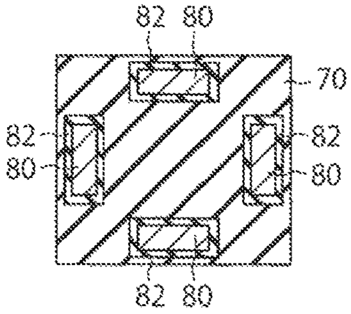
FIG. 2B is a cross-sectional view taken along the cutting plane B-B shown in FIG. 1.
Figure 2C:
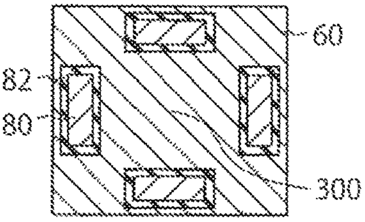
FIG. 2C is a cross-sectional view taken along the cutting plane C-C shown in FIG. 1.
Figure 2D:
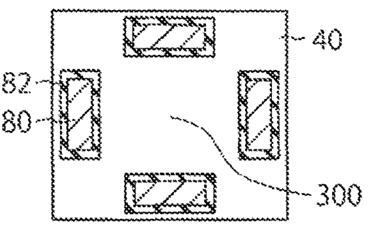
FIG. 2D is a cross-sectional view taken along the cutting plane D-D shown in FIG. 1.

FIG. 2A shows a cross-section of the imaging device of the present embodiment taken along the cutting plane A-A shown in FIG. 1, FIG. 2B shows a cross-section taken along the cutting plane B-B, FIG. 2C shows a cross-section taken along the cutting plane C-C, and FIG. 2D shows a cross-section taken along the cutting plane D-D. As shown in FIG. 2A, a light-shielding member 90 forms a rectangular lattice structure on the protective layer 70 so as to surround a pixel region 300. As will be described later, a region surrounded by a rectangle corresponds to a pixel region. The light-shielding member 90 having a lattice structure forms a portion of the inter-pixel light-shielding portion.

As shown in FIG. 2B, in the protective layer 70, the light-shielding member 80 is disposed in a substantially rectangular shape having sides that are not connected to each other so as to surround the pixel region 300. The light-shielding member 80 disposed in a substantially rectangular shape corresponds to the rectangular light-shielding member 90 immediately thereabove, and each side of the light-shielding member 80 is connected to a corresponding side of the light-shielding member 90. As shown in FIG. 2C, in the transparent electrode layer 60, the light-shielding member 80 is disposed in a substantially rectangular shape having sides that are not connected to each other so as to surround the pixel region 300. Further, as shown in FIG. 2D, in the photoelectric conversion layer 40, the light-shielding member 80 is disposed in a substantially rectangular shape having sides that are not connected to each other so as to surround the pixel region 300. That is, the light-shielding member 80 is disposed in a substantially rectangular shape having sides that are not connected to each other so as to surround the pixel region 300 in each layer of the protective layer 70, the transparent electrode layer 60, the buffer layer 50, and the photoelectric conversion layer 40.

In FIG. 2D, the pixel regions 300 surrounded by a substantially rectangular shape of the photoelectric conversion layer 40 are disposed in an array in the horizontal direction and the vertical direction. That is, the imaging device of the present embodiment includes a plurality of pixels, and the light-shielding member 80 forms a portion of the inter-pixel light-shielding portion. In each layer of the protective layer 70, the transparent electrode layer 60, the buffer layer 50, and the photoelectric conversion layer 40, the light-shielding member 80 partitions the pixel region 300 surrounded by substantially rectangular shapes. In other words, the light-shielding member 80 becomes a pixel-region-partitioning portion that partitions the pixel region. Further, the light-shielding member 80 and the light-shielding member 90 serve as inter-pixel light-shielding portions of partitioned pixels.

In this way, in the imaging device of the present embodiment, each pixel region 300 is partitioned by the light-shielding member 80 that constitutes an inter-pixel light-shielding portion. In the photoelectric conversion layer 40, the buffer layer 50, the transparent electrode layer 60, and the protective layer 70, the pixel region 300 is partitioned by the substantially rectangular light-shielding member 80 whose sides are not connected. On the protective layer 70, the pixel region 300 is partitioned by the light-shielding member 90 having a rectangular lattice structure. Therefore, light incident on a certain pixel region 300 is suppressed from entering a pixel region adjacent to the pixel region 300 by the light-shielding members 90 and 80 forming the inter-pixel light-shielding portion. Since the light-shielding member 80 has a substantially rectangular shape whose sides are not connected when viewed from the top surface of the transparent electrode layer 60, there is a possibility that light incident on an adjacent pixel region enters the pixel region from the portion where the sides are not connected. However, since the amount of light incident from an oblique direction is less than half that of the light incident from a direction perpendicular to the pixel region, it is possible to suppress significant deterioration in the light reception characteristics of the pixel region. Therefore, color mixing can be suppressed. Furthermore, the transparent electrode layer 60 is not separated by the light-shielding member 80 that constitutes the inter-pixel light-shielding portion, but has a continuous structure. This eliminates the need for wirings to electrically connect the transparent electrode layer to each pixel, and the layout can be easily performed.

(Manufacturing Method)

Figure 3A:
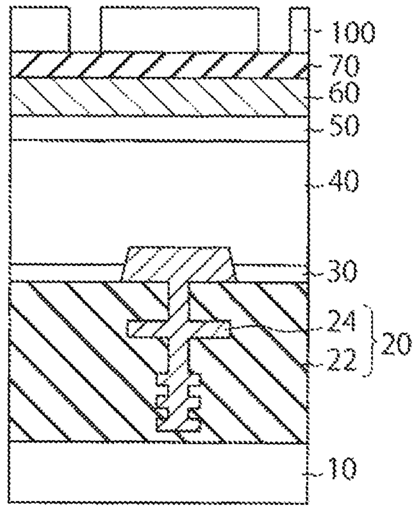
FIGS. 3A to 3F are cross-sectional views showing the manufacturing process for the imaging device of the first embodiment.

Next, a method for manufacturing the imaging device of the first embodiment will be described with reference to FIGS. 3A to 3F. First, as shown in FIG. 3A, the wiring stacked structure 20, the buffer layer 30, the photoelectric conversion layer 40, the buffer layer 50, the transparent electrode layer 60, and the protective layer 70 are sequentially stacked on the semiconductor substrate 10 containing silicon, for example. After that, a mask 100 is formed on the protective laxer 70, and this mask is patterned using lithography technology.

Figure 3B:
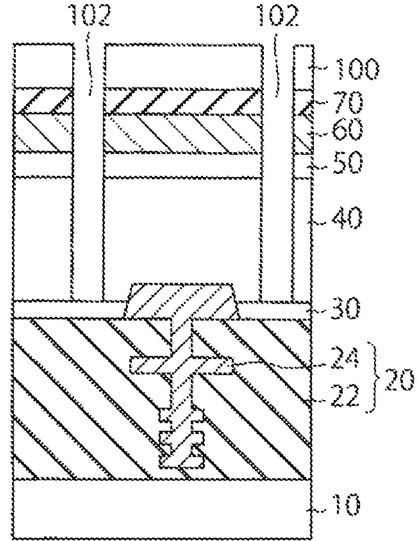

Next, as shown in FIG. 3B, the protective layer 70, the transparent electrode layer 60, the buffer layer 50, and the photoelectric conversion layer 40 are etched using the patterned mask 100 to form openings 102 extending from the protective layer 70 to the surface of the buffer layer 30. Thereafter, the mask 100 is removed.

Figure 3C:
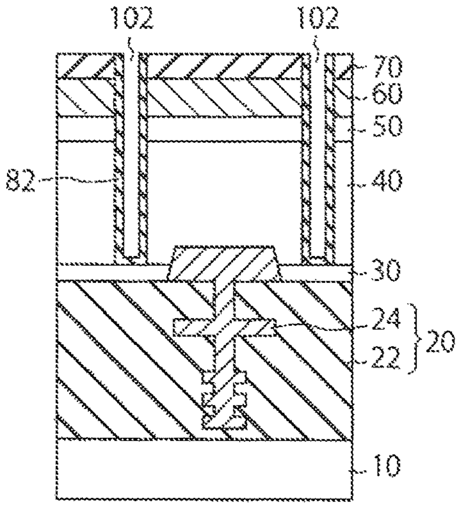
Figure 3D:
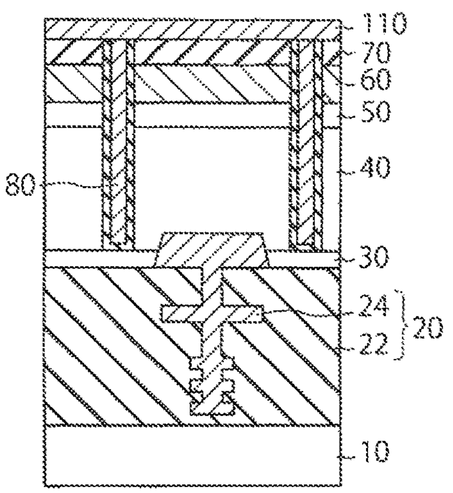
Figure 3E:
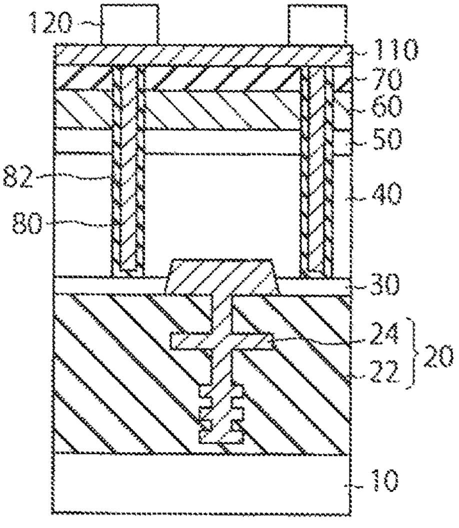
Figure 3F:
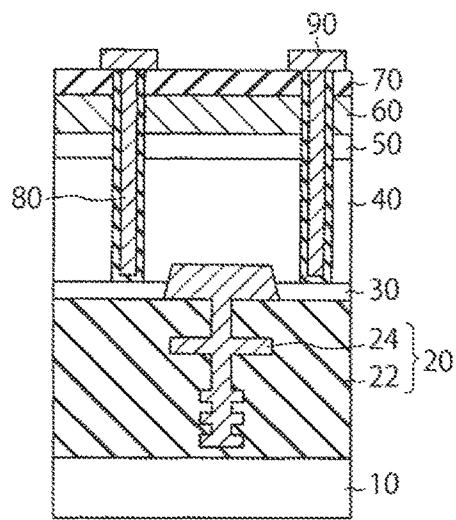

Next, as shown in FIG. 3C, an insulating film 82 is formed on the side and bottom surfaces of the openings 102. Subsequently, as shown in FIG. 3D, the openings 102 are filled with a metal containing tungsten, for example, to form the light-shielding member 80, and a metal film 110 is formed on the protective layer 70. After that, as shown in FIG. 3E, a mask 120 is formed on the metal film 110 to form the light-shielding member 90 as shown in FIG. 2A. By patterning the metal film 110 using this mask 120, a light-shielding member 90 is formed on the protective layer 70, as shown in FIG. 3F. In this way, the imaging device of the first embodiment is obtained.

In the imaging device of the first embodiment, the voltage applied to the inter-pixel light-shielding portion (light-shielding member) 80, 90 and the voltage applied to the transparent electrode layer 60 can be made different. For example, it is preferable that GND (ground potential) is applied to the transparent electrode layer 60 in order to suppress voltage drop. It is preferable that the inter-pixel light-shielding portions (light-shielding members) 80 and 90 apply a negative bias in order to form pinning of the photoelectric conversion layer. As described above, in the first embodiment, it is possible to apply different voltages to the inter-pixel light-shielding portions (light-shielding members) 80 and 90 and the transparent electrode layer 60, which will be described with reference to FIGS. 4A to 4C.

Figure 4A:
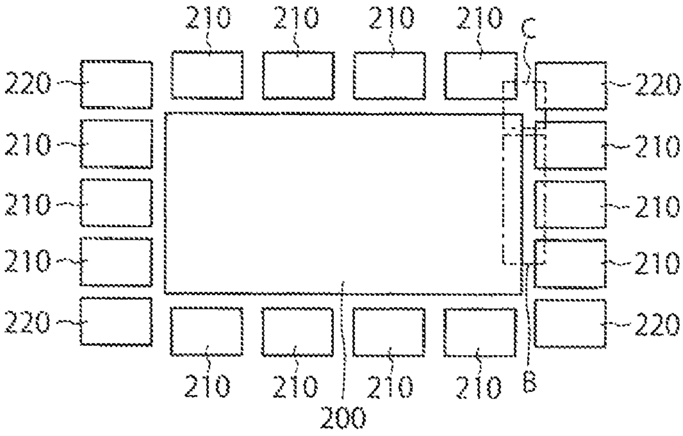
FIG. 4A is a plan view showing the imaging device of the first embodiment.

FIG. 4A shows a plan view of the imaging device of the first embodiment. This imaging device has a rectangular pixel array 200 in which pixels are disposed in an array. A plurality of terminals 210 are disposed corresponding to each of the four sides of this pixel array 200, and a ground potential is supplied from these terminals 210 to the transparent electrode layer 60 of the imaging device. Further, terminals 220 for supplying a negative bias voltage are disposed at each of the four corners of the pixel array 200, and the negative bias voltage is supplied from these terminals 220 to the light-shielding member 90 of the imaging device.

Figure 4B:
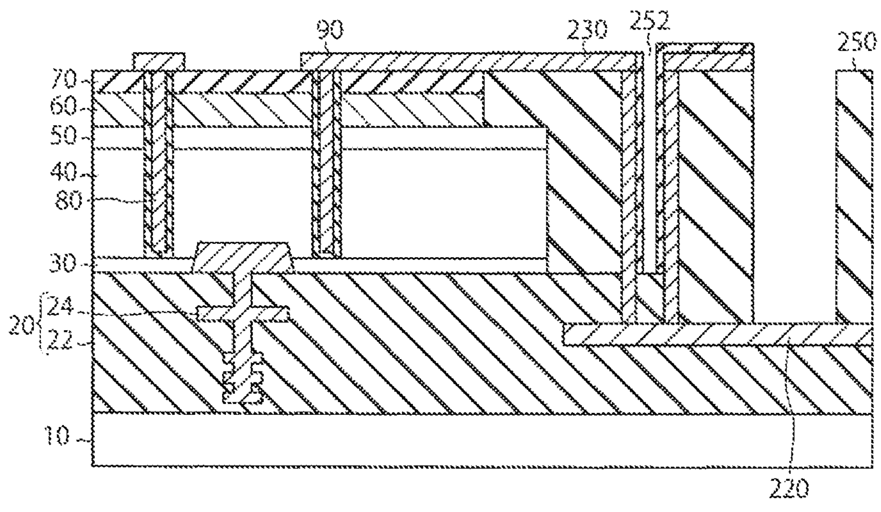
FIG. 4B is a cross-sectional view of portion B shown in FIG. 4A.
Figure 4C:
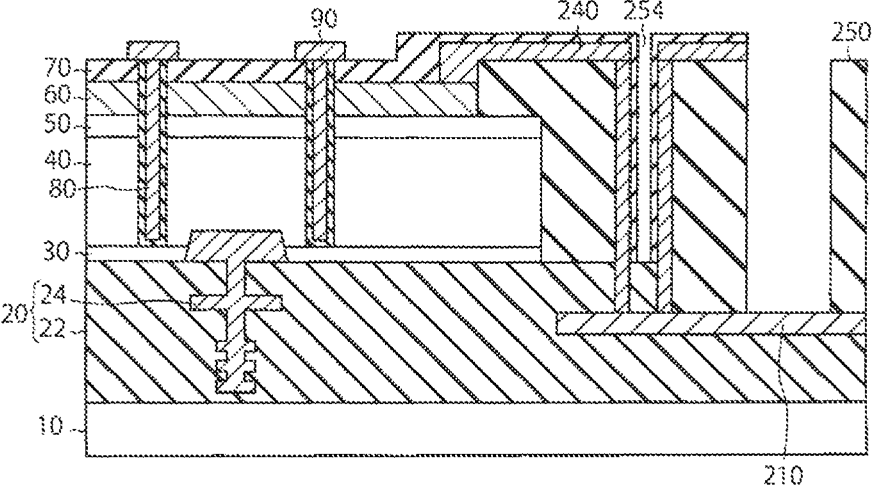
FIG. 4C is a cross-sectional view of portion C shown in FIG. 4A.

FIG. 4B shows a cross-sectional view of portion B shown in FIG. 4A, and FIG. 4C shows a cross-sectional view of portion C shown in FIG. 4A. As can be seen from FIG. 4B, the terminal 220 is provided in the insulating fin 250 outside the pixel array 200, and is supplied with a negative bias potential from the outside. This terminal 220 is disposed on the side surface of an opening 252 provided in the insulating film 250 and is connected to a wiring 230 disposed on the upper surface of the insulating film 250 and the upper surface of the protective layer 70. This wiring 230 is connected to the light-shielding member 90 disposed on the protective layer 70. That is, the negative bias potential is supplied to the light-shielding members 90 and 80 via the terminal 220 and the wiring 230.

Further, as can be seen from FIG. 4C, the terminal 210 is provided in the insulating film 250 outside the pixel array 200, and is supplied with a ground potential from the outside. This terminal 210 is disposed on the side surface of an opening 254 provided in the insulating film 250 and is connected to a wiring 240 disposed on the upper surface of the insulating film 250. This wiring 240 is connected to the transparent electrode layer 60 through an opening in the protective layer 70. That is, the ground potential is supplied to the transparent electrode layer 60 via the terminal 210 and the wiring 240. Note that in the first embodiment, as shown in FIGS. 2A to 2D, since the corners of the substantially rectangular shape formed by the light-shielding member 80 surrounding the pixel region 300 are not connected, stress on the semiconductor substrate is low.

As described above, according to the imaging device of the first embodiment, color mixing in layers above the transparent electrode layer can be suppressed. Further, the voltage applied to the light-shielding members 80 and 90 forming the inter-pixel light-shielding portion and the voltage applied to the transparent electrode layer 60 can be made different, and pinning of the photoelectric conversion layer 40 can be formed.

First Modification Example

Figure 5:
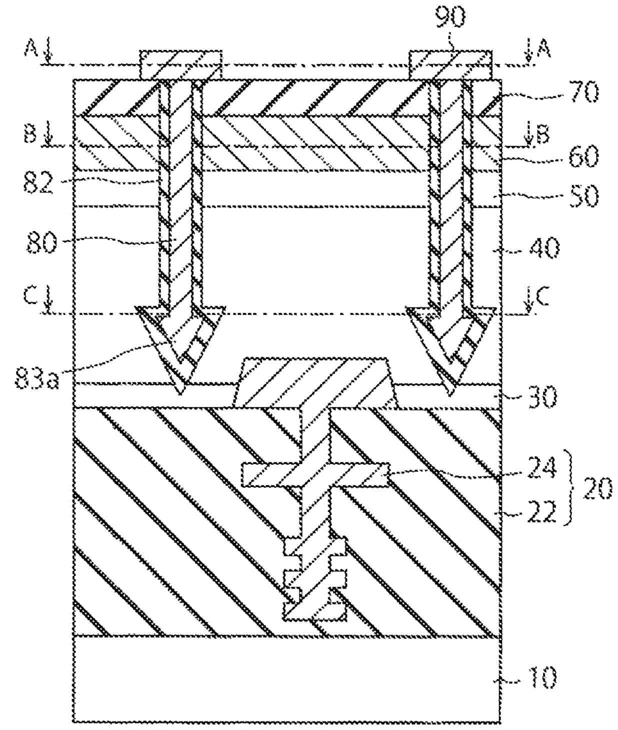
FIG. 5 is a cross-sectional view showing an imaging device according to a first modification of the first embodiment.
Figure 6A:
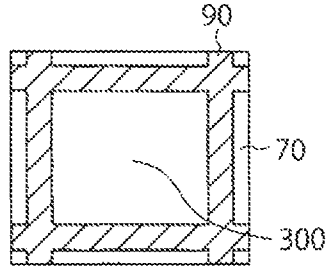
FIG. 6A is a cross-sectional view taken along the cutting plane A-A shown in FIG. 5.
Figure 6B:
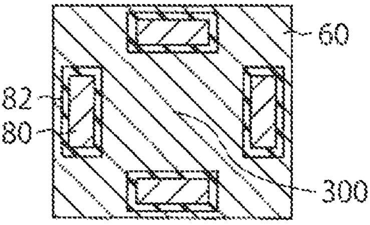
FIG. 6B is a cross-sectional view taken along the cutting plane B-B shown in FIG. 5.
Figure 6C:
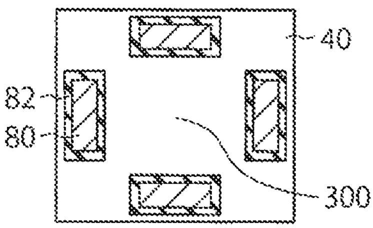
FIG. 6C is a cross-sectional view taken along the cutting plane C-C shown in FIG. 5.

FIG. 5 shows a cross-section of an imaging device according to a first modification of the first embodiment. Further, FIG. 6A shows a cross-section of the imaging device of the first modification taken along the cutting plane A-A shown in FIG. 5, FIG. 6B shows a cross-section taken along the cutting plane B-B, and FIG. 6C shows a cross-section taken along the cutting plane C-C. As can be seen from FIGS. 5 to 6C, in the imaging device of the first modification, a tip portion of the light-shielding member 80 in contact with the buffer layer 30 has a different shape from that of the imaging device of the first embodiment shown in FIG. 1. The light-shielding member 80 of the first embodiment has a constant cross-sectional shape in the photoelectric conversion layer 40. However, in the first modification, the tip portion has a pointed shape.

When the tip portion of the light-shielding member 80 has a pointed shape as in the first modification, the resistance to color mixing at the tip portion of the light-shielding member 80 can be increased compared to the first embodiment. It should be noted that this first modification can also suppress color mixing in layers above the transparent electrode layer, as in the first embodiment. In addition, the voltage applied to the light-shielding members 80 and 90 constituting the inter-pixel light-shielding portion can be made different from the voltage applied to the transparent electrode layer 60, and pinning of the photoelectric conversion layer 40 can be formed.

Second Modification Example

Figure 7:
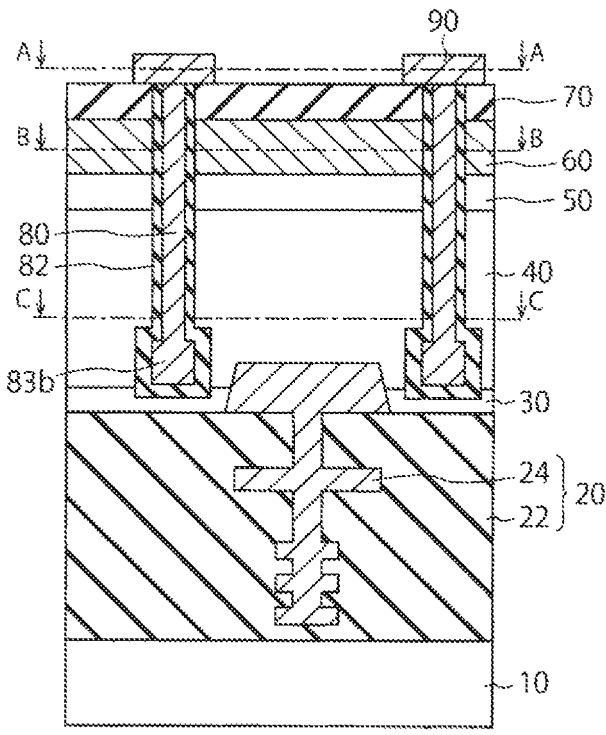
FIG. 7 is a cross-sectional view showing an imaging device according to a second modification of the first embodiment.
Figure 8A:
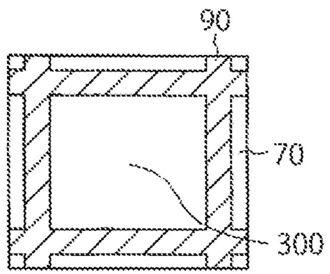
FIG. 8A is a cross-sectional view taken along the cutting plane A-A shown in FIG. 7.
Figure 8B:
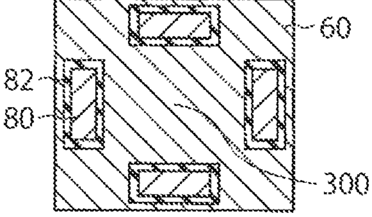
FIG. 8B is a cross-sectional view taken along the cutting plane B-B shown in FIG. 7.
Figure 8C:
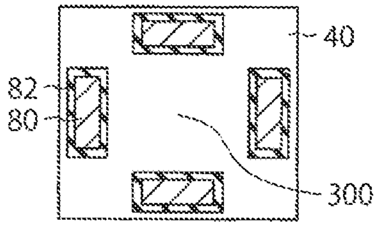
FIG. 8C is a cross-sectional view taken along the cutting plane C-C shown in FIG. 7.

FIG. 7 shows a cross-section of an imaging device according to a second modification of the first embodiment. Further, FIG. 8A shows a cross-section of the imaging device of the first modification taken along the cutting plane A-A shown in FIG. 7, FIG. 8B shows a cross-section taken along the cutting plane B-B, and FIG. 8C shows a cross-section taken along the cutting plane C-C. As can be seen from FIGS. 7 to 8C, in the imaging device of the second modification, a tip portion of the light-shielding member 80 in contact with the buffer layer 30 has a different shape from that of the imaging device of the first embodiment shown in FIG. 1. In the second modification, the light-shielding member 80 has a shape in which the cross-sectional area of the tip portion is larger than that of the other portion (for example, the portion close to the buffer layer 50).

When the cross-sectional area of the tip portion of the light-shielding member 80 is larger than that of the other portions as in the second modification, the resistance to color mixing at the tip portion of the light-shielding member 80 can be increased compared to the first embodiment. It should be noted that this second modification can also suppress color mixing in layers above the transparent electrode layer in the same manner as in the first embodiment. In addition, the voltage applied to the light-shielding members 80 and 90 constituting the inter-pixel light-shielding portion can be made different from the voltage applied to the transparent electrode layer 60, and pinning of the photoelectric conversion layer 40 can be formed.

Second Embodiment

Figure 9:
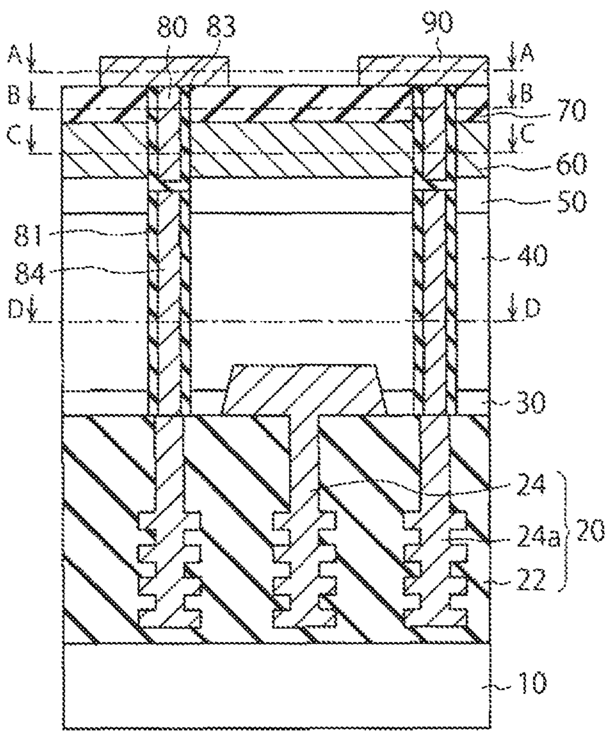
FIG. 9 is a cross-sectional view showing an imaging device according to a second embodiment.
Figure 10A:
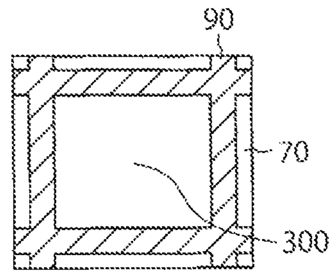
FIG. 10A is a cross-sectional view taken along the cutting plane A-A shown in FIG. 9.
Figure 10B:
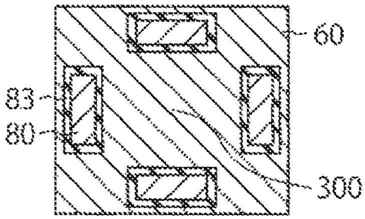
FIG. 10B is a cross-sectional view taken along the cutting plane B-B shown in FIG. 9.
Figure 10C:
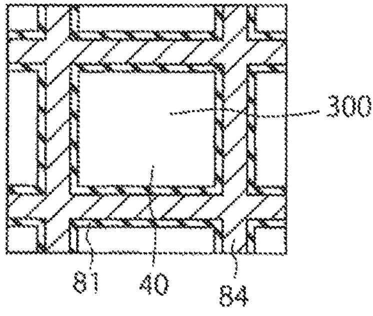
FIG. 10C is a cross-sectional view taken along the cutting plane C-C shown in FIG. 9.

FIG. 9 shows a cross-section of the imaging device according to the second embodiment, FIG. 10A shows a cross-section taken along the cutting plane A-A shown in FIG. 9, FIG. 10B shows a cross-section taken along the cutting plane B-B, and FIG. 10C shows a cross-section taken along the cutting plane C-C.

The imaging device of the second embodiment has a structure in which the light-shielding member 80 is divided into a light-shielding member 84 and a light-shielding member 86 in the imaging device shown in FIG. 1, and the wiring stacked structure 20 is replaced with a wiring stacked structure 20A. The light-shielding member 84 has a structure that penetrates the photoelectric conversion layer 40 and the buffer layer 30 from the buffer layer 50, and an insulating film 81 is provided on the side surface. Note that when the light-shielding member 84 includes an insulating material, the insulating film 81 may be removed. The light-shielding member 86 penetrates the protective layer 70 and the transparent electrode layer 60 and reaches into the buffer layer 50. An insulating film 83 is provided on the side and bottom surfaces of the light-shielding member 86, and the light-shielding member 84 and the light-shielding member 86 are not electrically connected. As can be seen from FIGS. 10A and 2A, the light-shielding member 90 has the same cross-sectional structure, on the protective layer 70, as the light-shielding member 90 of the first embodiment. Furthermore, as can be seen from FIGS. 10B and 2C, the light-shielding member 86 has the same shape, in the transparent electrode layer 60, as the light-shielding member 80 of the first embodiment.

Wirings 24 and 24*a* disposed in the insulating film 22 are disposed in the wiring stacked structure 20A, and the wiring 24*a* supplies a negative bias potential to the light-shielding member 84. The light-shielding member 84 has a cross-sectional shape in the photoelectric conversion layer 40, as shown in FIG. 10C, which is different from that of the light-shielding member 80 of the first embodiment shown in FIG. 2D, and is disposed in a rectangular lattice shape so as to surround each pixel region 300. Further, the light-shielding member 84 is electrically connected to the wiring 24*a* at the lattice points.

In the imaging device of the second embodiment configured in this way, since the side surfaces of each pixel in the photoelectric conversion layer 40 are completely surrounded by the rectangular lattice-shaped light-shielding member 84, that is, the inter-pixel light-shielding film, color mixing can be further suppressed compared to the first embodiment. Further, a bias potential different from that applied to the light-shielding member 84 can be applied to the light-shielding member 90 and the light-shielding member 86.

(Manufacturing Method)

Figure 11A:
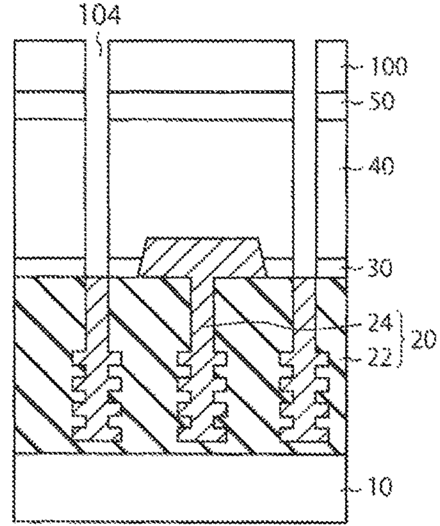
FIGS. 11A to 11I are cross-sectional views showing the manufacturing process for the imaging device of the second embodiment.

Next, a method for manufacturing the imaging device of the second embodiment will be described with reference to FIGS. 11A to 11I. First, as shown in FIG. 11A, a wiring stacked structure 20A, a buffer layer 30, a photoelectric conversion layer 40, and a buffer layer 50 are sequentially stacked on a semiconductor substrate 10 containing silicon, for example. After that, a mask 100 is formed on the buffer layer 50, and this mask is patterned using lithography technology. This patterning is for forming a lattice-like light-shielding member shown in FIG. 10C. Subsequently, using the patterned mask 100, the buffer layer 50, photoelectric conversion layer 40, and buffer layer 30 are etched to form an opening 104 that reaches the upper surface of the wiring stacked structure 20A. Thereafter, the mask 100 is removed.

Figure 11B:
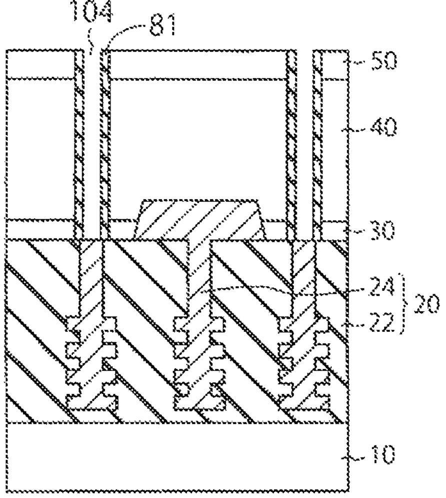
Figure 11C:
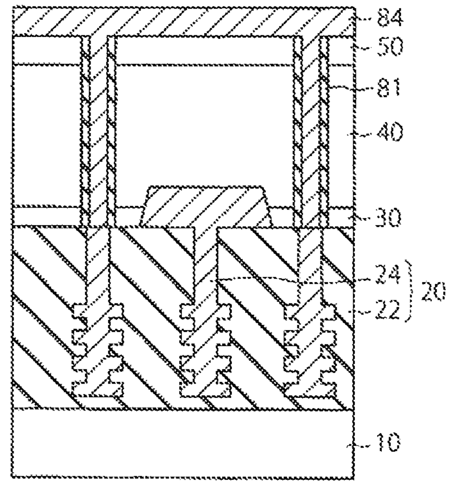
Figure 11D:
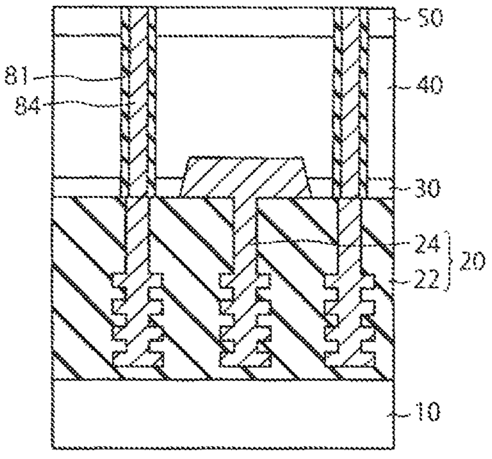

Next, as shown in FIG. 11B, an insulating film 81 is formed on the side surface of the opening 104. Although the insulating film 81 is also formed on the bottom surface of the opening 104, it is removed. Subsequently, as shown in FIG. 11C, the opening 104 is filled with a metal containing tungsten, for example. At this time, a metal layer is also formed on the upper surface of the buffer layer 50. This metal layer is removed using, for example, CMP (Chemical Mechanical Polishing) as shown in FIG. 11D, and a light-shielding member 84 is formed in the opening 104.

Figure 11E:
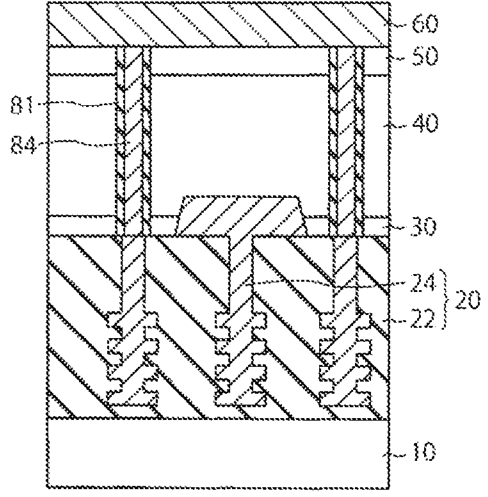
Figure 11F:
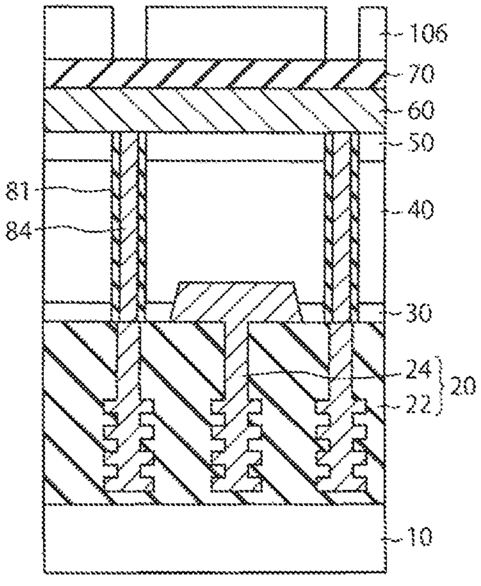
Figure 11G:
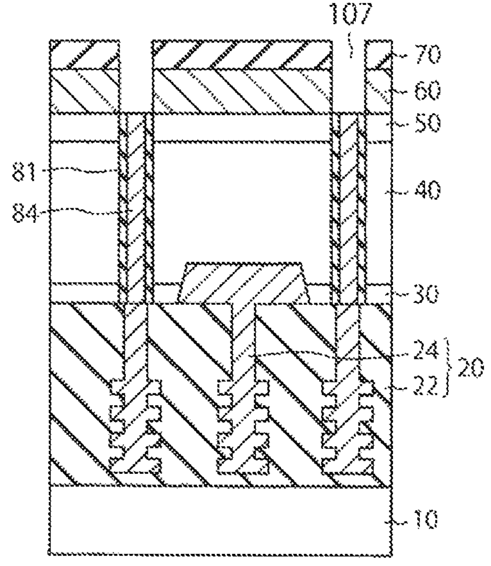

Next, as shown in FIG. 11E, a transparent electrode layer 60 is formed to cover the light-shielding member 84 and the buffer layer 50. Subsequently, as shown in FIG. 11F, a protective layer 70 is formed on the transparent electrode layer 60, and a patterned mask 106 is further formed on the protective layer 70. This patterned mask 106 is for forming the light-shielding member 86. After that, the protective layer 70 and the transparent electrode layer 60 are etched using the mask 106 to form the opening 107. After that, the mask 106 is removed (FIG. 11G).

Figure 11H:
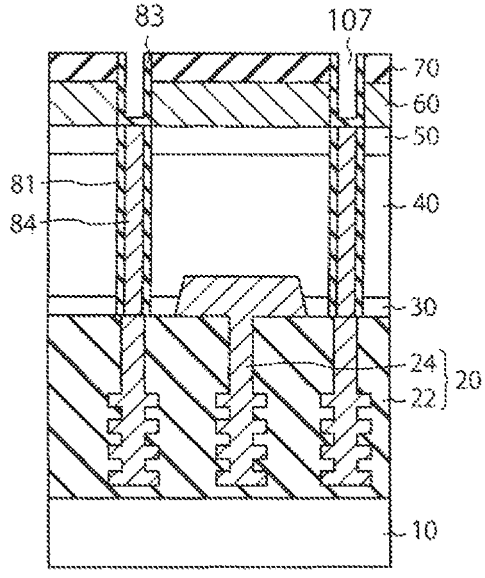
Figure 11I:
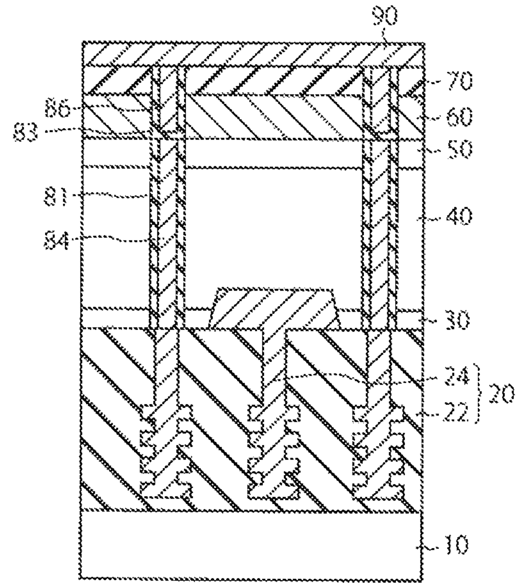

Next, as shown in FIG. 11H, an insulating film 83 is formed on the bottom and side surfaces of the opening 107. Subsequently, as shown in FIG. 11I, a metal film containing, for example, tungsten is formed on the protective layer 70 while filling the opening 107. At this time, the metal film embedded in the opening 107 becomes the light-shielding member 86. After that, the light-shielding member 90 is formed on the protective layer 70 by patterning the metal film on the protective layer 70. In this way, the imaging device of the second embodiment is obtained.

As described above, the imaging device of the second embodiment can suppress color mixing in layers above the transparent electrode layer, similarly to the imaging device of the first embodiment. In addition, color mixing in layers below the transparent electrode layer can be suppressed more than in the first embodiment.

Modification

Figure 12:
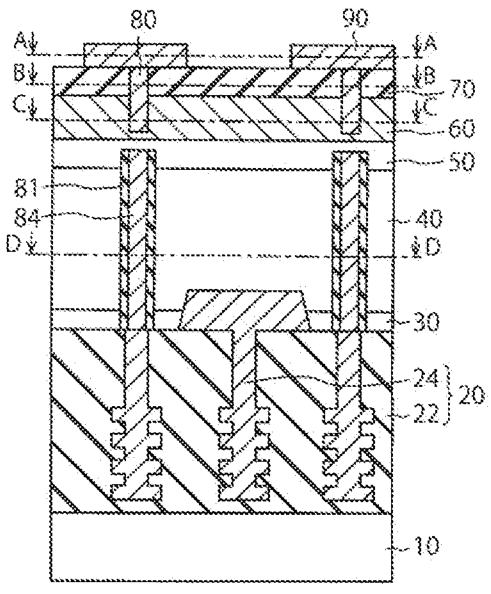
FIG. 12 is a cross-sectional view showing an imaging device according to a third embodiment.
Figure 13A:
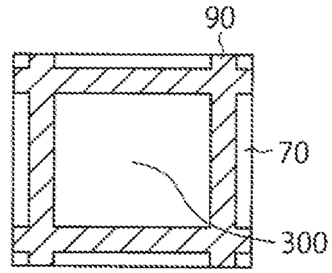
FIG. 13A is a cross-sectional view taken along the cutting plane A-A shown in FIG. 12.
Figure 13B:
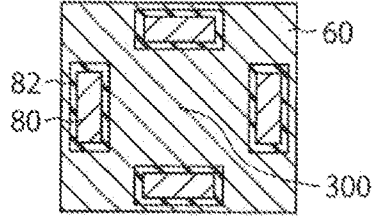
FIG. 13B is a cross-sectional view taken along the cutting plane B-B shown in FIG. 12.
Figure 13C:
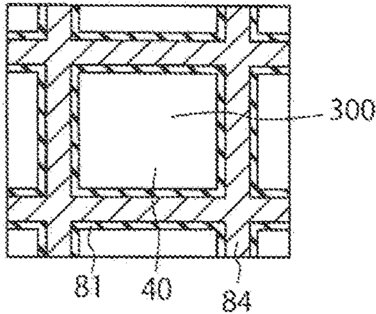
FIG. 13C is a cross-sectional view taken along the cutting plane C-C shown in FIG. 12.

FIG. 12 shows a cross-section of an imaging device according to a modification of the second embodiment, FIG. 13A shows a cross-section taken along the cutting plane A-A shown in FIG. 12, FIG. 13B shows a cross-section taken along the cutting plane B-B, and FIG. 13C shows a cross-section taken along the cutting plane C-C.

The imaging device of this modification has the same structure as the imaging device shown in FIG. 9, except that the light-shielding member 86 does not penetrate the transparent electrode layer 60. That is, in this modification, the bottom surface of the light-shielding member 86 does not reach the top surface of the buffer layer 50 and is located in the middle of the transparent electrode layer 60.

The imaging device of this modification can also obtain the same effect as the second embodiment.

Third Embodiment

An imaging device according to the third embodiment will be described with reference to FIG. 14. In any of the imaging devices of the first embodiment, the second embodiment, and their modifications, the cross-sectional shape of the light-shielding member 80 or 86 in the transparent electrode layer 60 has a substantially rectangular shape whose sides are not connected, as shown in FIG. 2C.

Figure 14:
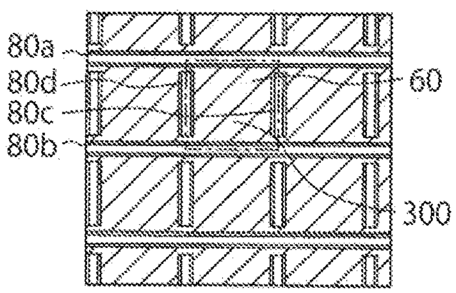
FIG. 14 is a cross-sectional view showing a transparent electrode layer of an imaging device according to the third embodiment.

FIG. 14 shows the cross-sectional shape of the light-shielding member 80 in the transparent electrode layer 60 of the imaging device of the third embodiment. As shown in FIG. 14, the light-shielding member 80 in the third embodiment is disposed to surround the pixel region 300, and has a first portion 80*a* and a second portion 80*b* extending along the horizontal direction (first direction) in FIG. 14, and a third portion 80*c* and a fourth portion 80*d* extending in the vertical direction (second direction) in FIG. 14. The third portion 80*c* and the fourth portion 80*d* are disposed in a region between the first portion 80*a* and the second portion 80*b*. That is, the first portion 80*a*, the second portion 80*b*, the third portion 80*c*, and the fourth portion 80*d* disposed to surround the pixel region 300 form sides of a substantially rectangular shape, and are disposed so that these sides are not connected to each other. That is, the third portion 80*c* is disposed so as not to be connected to the first portion 80*a* and the second portion 80*b*, and the portion 80*d* is disposed so as not to be connected to the first portion 80*a* and the second portion 80*b*.

In the present embodiment, since the first portion 80*a* and the second portion 80*b* extend along the first direction, the transparent electrode layer 60 of one pixel region 300 is electrically connected to the transparent electrode layer of an adjacent pixel region in the first direction. However, the transparent electrode layer 60 is not electrically connected to the transparent electrode layer of the pixel region adjacent in the second direction. Therefore, color mixing from the second direction can be more suppressed than in the first and second embodiments and their modifications.

Fourth Embodiment

An imaging device according to the fourth embodiment will be described with reference to FIG. 15. The imaging device of the fourth embodiment has a configuration in which the cross-sectional shape of the light-shielding member 80 in the transparent electrode layer 60 in the imaging device of the third embodiment is changed to the shape shown in FIG. 15.

Figure 15:
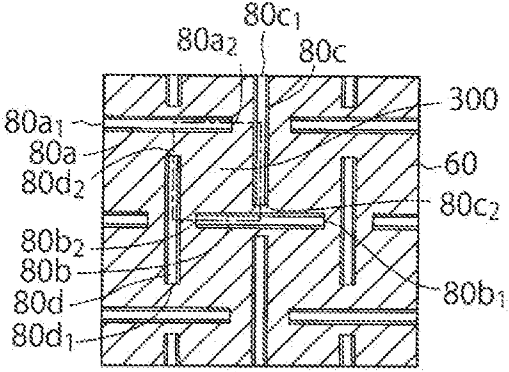
FIG. 15 is a cross-sectional view showing a transparent electrode layer of an imaging device according to a fourth embodiment.

As shown in FIG. 15, the light-shielding member 80 of the fourth embodiment has a first portion 80*a* and a second portion 80*b* extending along the first direction, and a third portion 80*c* and a fourth portion 80*d* extending along the second direction intersecting the first direction. These first to fourth portions 80*a* to 80*d* are disposed so as not to intersect each other. A portion of the first portion 80*a*, a portion of the second portion 80*b*, a portion of the third portion 80*c*, and a portion of the fourth portion 80*d* each constitute the sides of a substantially rectangular shape surrounding the pixel region 300.

The first portion 80*a* has a first end 80*a*1 and a second end 80*a*2 disposed along the first direction, the second portion 80*b* has a third end 80*b*1 and a fourth end 80*b*2 disposed along the first direction, the third portion 80*c* has a fifth end 80*cl* and a sixth end 80*c*2 disposed along the second direction, and the fourth portion 80*d* has a seventh end 80*d*1 and an eighth end 80*d*2 disposed along the second direction. A portion from a portion (for example, the central portion) of the first portion 80*a* to the second end 80*a*2 constitutes a side of a substantially rectangular shape, a portion from a portion (for example, the central portion) of the second portion 80*b* to the fourth end 80*b*2 constitutes a side of a substantially rectangular shape, a portion from a portion (for example, the central portion) of the third portion 80*c* to the sixth end 80*c*2 constitutes a side of a substantially rectangular shape, and a portion from a portion (for example, the central portion) of the fourth portion 80*d* to the eighth end 80*d*2 constitutes a side of a substantially rectangular shape.

Therefore, the direction from the first end 80*al* to the second end 80*a*2 in the first portion 80*a* is located between the fifth end 80*c*1 and the sixth end 80*c*2 of the third portion 80*c*, and the second end 80*a*2 is not connected to the third portion 80*c*. The direction from the third end 80*b*1 to the fourth end 80*b*2 in the second portion 80*b* is located between the seventh end 80*d*1 and the eighth end 80*d*2 of the fourth portion 80*d*, and the fourth end 80*b*2 is not connected to the fourth portion 80*d*. The direction from the fifth end 801 to the sixth end 80*c*2 in the third portion 80*c* is located between the third end 80*b*1 and the fourth end 80*b*2 of the second portion 80*b*, and the sixth end 80*c*2 is not connected to the second portion 80*b*. The direction from the seventh end 80*d*1 to the eighth end 80*d*2 in the fourth portion 80*d* is located between the first end 80*al* and the second end 80*a*2 of the first portion 80*a*, and the eighth end 80*d*2 is not connected to the first portion 80*a*.

In the fourth embodiment configured in this manner, each corner of the substantially rectangular shape of the pixel is not connected to the sides forming this corner. Therefore, all the pixel regions 300 are electrically connected, and there is no need for wiring to electrically connect the transparent electrode layer to each pixel, and the layout can be easily performed. Further, in the fourth embodiment, as in the first embodiment, it is possible to suppress the occurrence of color mixing. Note that in the fifth embodiment, since the lengths of the first to fourth portions can be increased, it is possible to suppress warping of the semiconductor substrate during processing.

Fifth Embodiment

An imaging device according to a fifth embodiment will be described with reference to FIG. 16. The imaging device of the fifth embodiment has a configuration in which the cross-sectional shape of the light-shielding member 80 in the transparent electrode layer 60 in the imaging device of the fourth embodiment is changed to the shape shown in FIG. 16.

Figure 16:
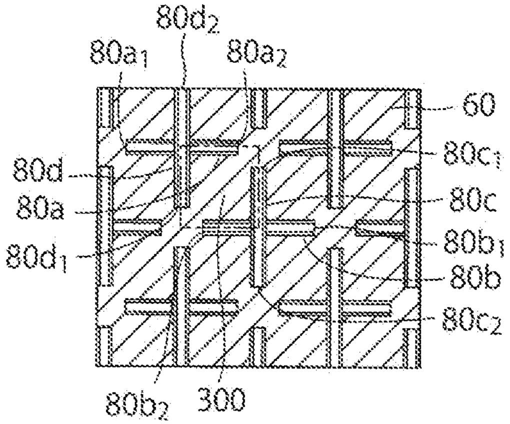
FIG. 16 is a cross-sectional view showing a transparent electrode layer of an imaging device according to a fifth embodiment.

As shown in FIG. 16, the light-shielding member 80 of the fifth embodiment has a first portion 80*a* and a second portion 80*b* extending along the first direction, and a third portion 80*c* and a fourth portion 80*d* extending along the second direction intersecting the first direction. The first portion 80*a* is connected to the fourth portion 80*d* at the central portion but is not connected to the third portion 80*c*, and the second portion 80*b* is connected to the third portion 80*c* at the central portion but is not connected to the fourth portion 80*d*. A portion of the first portion 80*a*, a portion of the second portion 80*b*, a portion of the third portion 80*c*, and a portion of the fourth portion 80*d* each constitute the sides of a substantially rectangular shape surrounding the pixel region 300.

The first portion 80*a* has a first end 80*al* and a second end 80*a*2 disposed along the first direction, the second portion 80*b* has a third end 80*b*1 and a fourth end 80*b*2 disposed along the first direction, the third portion 80*c* has a fifth end 801 and a sixth end 80*c*2 disposed along the second direction, and the fourth portion 80*d* has a seventh end 80*d*1 and an eighth end 80*d*2 disposed along the second direction. A portion from the central portion of the first portion 80*a* to the second end 80*a*2 constitutes a side of a substantially rectangular shape, a portion from the central portion of the second portion 80*b* to the fourth end 80*b*2 constitutes a side of a substantially rectangular shape, a portion from the central portion of the third portion 80*c* to the fifth end 80*c*1 constitutes a side of a substantially rectangular shape, and a portion from the central portion of the fourth portion 80*d* to the seventh end 80*d*1 constitutes a side of a substantially rectangular shape.

Therefore, in the substantially rectangular cross-sectional shape of the transparent electrode layer 60 of the light-shielding member 80 that partitions the pixel region 300, the corners formed by the first portion 80*a* and the third portion are not connected, and the corners formed by the first portion 80*a* and the third portion are not connected.

In the fifth embodiment configured in this way, the two diagonal corners of the substantially rectangular pixel region 300 are not connected to the sides forming these corners. Therefore, all the pixel regions 300 are electrically connected, and there is no need for wiring to electrically connect the transparent electrode layer to each pixel, and the layout can be easily performed. Also, in the fifth embodiment, like the first embodiment, it is possible to suppress the occurrence of color mixing. Note that in the fifth embodiment, since the lengths of the first to fourth portions can be increased, it is possible to suppress warping of the semiconductor substrate during processing.

Sixth Embodiment

An imaging device according to the sixth embodiment will be described with reference to FIG. 17. The imaging device of the sixth embodiment has a configuration in which the cross-sectional shape of the light-shielding member 80 in the transparent electrode layer 60 in the imaging device of the first embodiment is changed to the shape shown in FIG. 17.

Like the light-shielding member 80 of the first embodiment shown in FIG. 2C, the light-shielding member 80 of the sixth embodiment has a first portion 80*a*, a second portion 80*b*, a third portion 80*c*, and a fourth portion 80*d*, which are disposed in a substantially rectangular shape and are not connected to each other. The light-shielding member 80 further includes a fifth portion 80*e*, a sixth portion 80*f*, a seventh portion 80*g*, and an eighth portion 80*h* which are disposed at the corners of the substantially rectangular shape. The fifth portion 80*e* is disposed at the corner formed by the first portion 80*a* and the third portion 80*c* and is disposed so as not to be connected to the first portion 80*a* and the third portion 80*c*. The sixth portion 80*f* is disposed at the corner formed by the third portion 80*c* and the second portion 80*b* and is disposed so as not to be connected to the third portion 80*c* and the second portion 80*b*. The seventh portion 80*g* is disposed at the corner formed by the second portion 80*b* and the fourth portion 80*d* and is disposed so as not to be connected to the second portion 80*b* and the fourth portion 80*d*. The eighth portion 80*h* is disposed at the corner formed by the fourth portion 80*d* and the first portion 80*a* and is disposed so as not to be connected to the fourth portion 80*d* and the first portion 80*a*.

In the sixth embodiment configured in this manner, the fifth portion 80*e* to the eighth portion 80*h* are disposed at the four diagonal corners of the substantially rectangular pixel region 300, and the first to eighth portions 80*a* to 80*h* are disposed so as not to be connected to each other. Therefore, all the pixel regions 300 are electrically connected, and there is no need for wiring to electrically connect the transparent electrode layer to each pixel, and the layout can be easily performed. In addition, in the sixth embodiment, since the fifth to eighth portions 80*e* to 80*h* are disposed at the respective corners of the substantially rectangular shape, it is possible to prevent light from adjacent pixels from entering from oblique directions and further suppress the occurrence of color mixing compared to the case of the first embodiment. In addition, in the sixth embodiment, since the fifth to eighth portions are disposed at the corners of the substantially rectangular shape, it is possible to suppress warping of the semiconductor substrate during processing.

Seventh Embodiment

Figure 18:
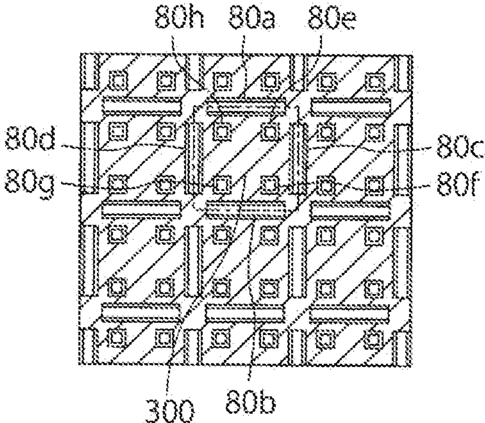
FIG. 18 is a cross-sectional view showing a transparent electrode layer of an imaging device according to a seventh embodiment.

An imaging device according to the seventh embodiment will be described with reference to FIG. 18. The imaging device of the seventh embodiment has a configuration in which the cross-sectional shape of the light-shielding member 80 in the transparent electrode layer 60 in the imaging device of the sixth embodiment is changed to the shape shown in FIG. 18.

Figure 17:
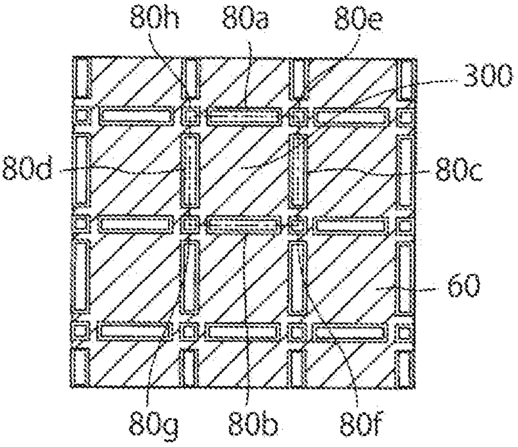
FIG. 17 is a cross-sectional view showing a transparent electrode layer of an imaging device according to a sixth embodiment.

The light-shielding member 80 of the seventh embodiment has a configuration in which the fifth portion 80*e*, the sixth portion 80*f*, the seventh portion 80*g*, and the eighth portions 80*h* disposed at the corners of the substantially rectangular shape in the light-shielding member 80 of the sixth embodiment shown in FIG. 17 are moved from the corresponding corners to the inner region of the pixel region 300. The fifth portion 80*e* is moved to the inside of the pixel region 300 from the corner formed by the first portion 80*a* and the third portion 80*c* and is disposed so as not to be connected to the first portion 80*a* and the third portion 80*c*. The sixth portion 80*f* is moved to the inside of the pixel region 300 from the corner formed by the third portion 80*c* and the second portion 80*b* and is disposed so as not to be connected to the third portion 80*c* and the second portion 80*b*. The seventh portion 80*g* is moved to the inside of the pixel region 300 from the corner formed by the second portion 80*b* and the fourth portion 80*d* and is disposed so as not to be connected to the second portion 80*b* and the fourth portion 80*d*. The eighth portion 80*h* is moved to the inside of the pixel region 300 from the corner formed by the fourth portion 80*d* and the first portion 80*a* and is disposed so as not to be connected to the fourth portion 80*d* and the first portion 80*a*. Note that the first to eighth portions are disposed so as not to be connected to each other.

In the seventh embodiment configured in this manner, the fifth to eighth portions 80*e* to 80*h* are disposed inside the pixel region 300 from the corners of the substantially rectangular shape of the pixel region 300, and the first to eighth portions 80*a* to 80*h* are disposed so as not to be connected to each other. Therefore, all the pixel regions 300 are electrically connected, and there is no need for wiring to electrically connect the transparent electrode layer to each pixel, and the layout can be easily performed. Further, in the sixth embodiment, since the fifth to eighth portions 80*e* to 80*h* are disposed inside the pixel region 300 from each corner of the substantially rectangular shape, it is possible to prevent light from adjacent pixels from entering from oblique directions and further suppress the occurrence of color mixing compared to the case of the first embodiment. Note that in the seventh embodiment, since the fifth to eighth portions are disposed inside the corners of the substantially rectangular shape, it is possible to suppress the semiconductor substrate from warping during processing.

Application Examples

The technology according to the present disclosure can be applied to various products. For example, the technology according to the present disclosure may be implemented as an apparatus mounted on any kind of mobile body such as an automobile, an electric vehicle, a hybrid electric vehicle, a motorcycle, a bicycle, a personal mobility, an airplane, a drone, a ship, a robot, a construction machine, or an agricultural machine (tractor).

Figure 19:
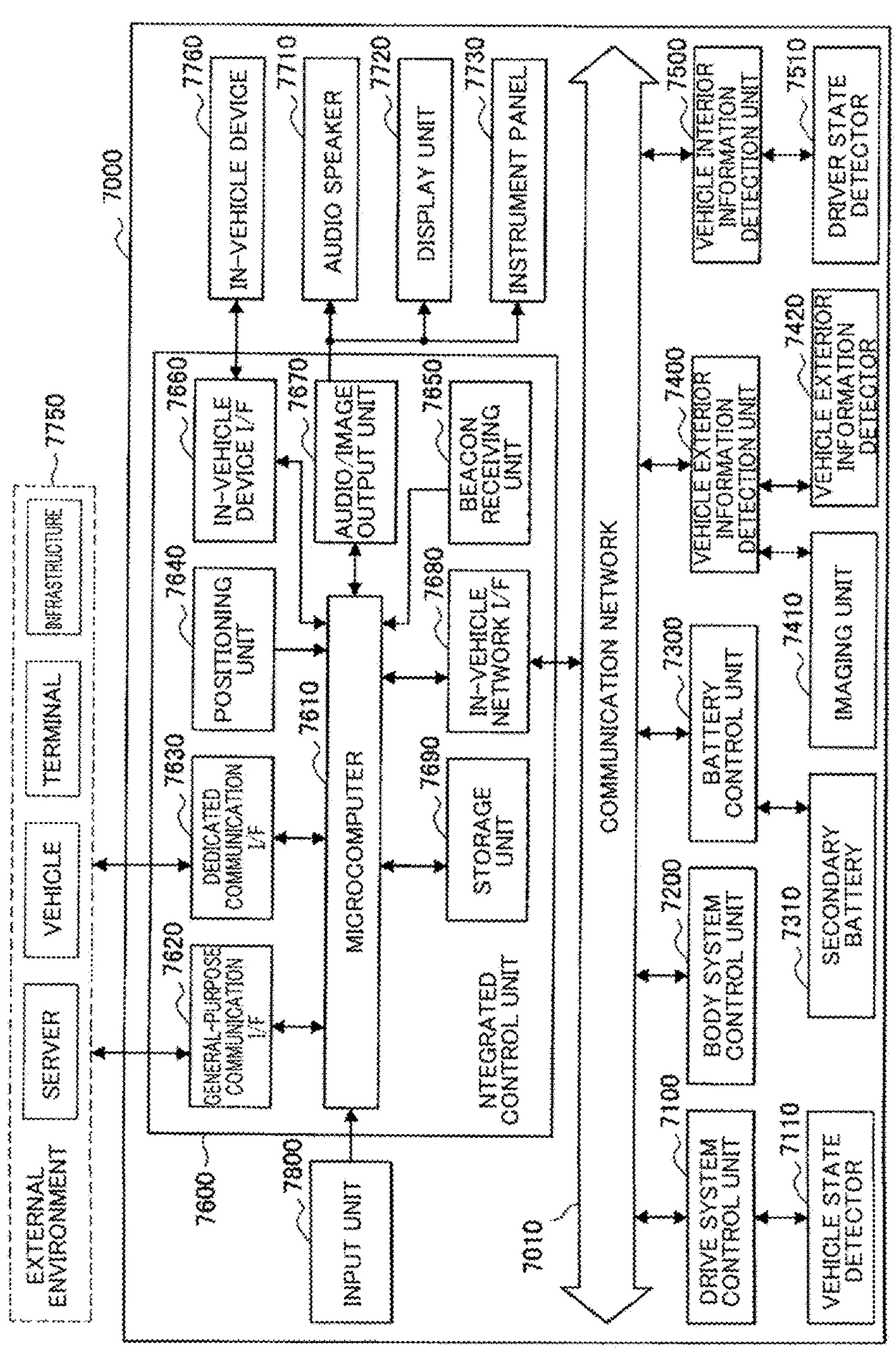
FIG. 19 is a block diagram illustrating an example of an overall configuration of a vehicle control system.

FIG. 19 is a block diagram showing a schematic configuration example of a vehicle control system 7000, which is an example of a mobile object control system to which the technology according to the present disclosure can be applied. The vehicle control system 7000 includes multiple electronic control units connected via a communication network 7010. In the example shown in FIG. 19, the vehicle control system 7000 includes a drive system control unit 7100, a body system control unit 7200, a battery control unit 7300, a vehicle exterior information detection unit 7400, a vehicle interior information detection unit 7500, and an integrated control unit 7600. The communication network 7010 connecting these plurality of control units may be an in-vehicle communication network based on any standard such as, for example, CAN (Controller Area Network), LIN (Local Interconnect Network), LAN (Local Area Network), or FlexRay (registered trademark).

Each control unit includes a microcomputer that performs arithmetic processing according to various programs, a storage unit that stores programs executed by the microcomputer, parameters used for various arithmetic operations, and the like, and a drive circuit that drives various control target devices. Each control unit includes a network I/F for performing communication with other control units via the communication network 7010, and includes a communication I/F for performing communication through wired communication or wireless communication with devices, sensors, or the like inside or outside the vehicle. In FIG. 19, a microcomputer 7610, a general-purpose communication I/F 7620, a dedicated communication I/F 7630, a positioning unit 7640, a beacon reception unit 7650, an in-vehicle device I/F 7660, an audio/image output unit 7670, an in-vehicle network I/F 7680, and a storage unit 7690 are shown as functional configurations of the integrated control unit 7600. The other control units also include a microcomputer, a communication I/F, a storage unit, and the like.

The drive system control unit 7100 controls the operation of devices related to the drive system of the vehicle according to various programs. For example, the drive system control unit 7100 functions as a control device for a driving force generation device for generating driving force for the vehicle, such as an internal, combustion engine or a drive motor, a driving force transmission mechanism for transmitting the driving force to wheels, a steering mechanism for adjusting a steering angle of the vehicle, a braking device that generates braking force for the vehicle, and the like. The drive system control unit 7100 may have a function as a control device such as ABS (Antilock Brake System) or ESC (Electronic Stability Control).

A vehicle state detector 7110 is connected to the drive system control unit 7100. The vehicle state detector 7110 includes, for example, at least one of a gyro sensor that detects an angular velocity of an axial rotation motion of a vehicle body, an acceleration sensor that detects an acceleration of a vehicle, and sensors for detecting an amount of operation with respect to an accelerator pedal, an amount of operation with respect to a brake pedal, a steering angle of a steering wheel, an engine speed, a rotation speed of wheels, and the like. The drive system control unit 7100 performs arithmetic processing using a signal input from the vehicle state detector 7110 to control an internal combustion engine, a drive motor, an electric power steering device, a brake device, and the like.

The body system control unit 7200 controls operations of various devices equipped in the vehicle body in accordance with various programs. For example, the body system control unit 7200 functions as a control device of a keyless entry system, a smart key system, a power window device, or various lamps such as a head lamp, a back lamp, a brake lamp, a turn indicator, and a fog lamp. In this case, radio waves emitted from a portable device in place of a key or signals of various switches can be input to the body system control unit 7200. The body system control unit 7200 receives inputs of radio waves or signals and controls a door lock device, a power window device, and a lamp of the vehicle.

The battery control unit 7300 controls a secondary battery 7310 which is a power supply source of a driving motor in accordance with various programs. For example, information such as a battery temperature, a battery output voltage, or a remaining capacity of a battery is input from a battery device including the secondary battery 7310 to the battery control unit 7300. The battery control unit 7300 performs arithmetic processing using such a signal and performs temperature adjustment control of the secondary battery 7310 or control of a cooling device equipped in the battery device.

The vehicle exterior information detection unit 7400 detects information external to the vehicle in which the vehicle control system 7000 is mounted. For example, at least one of an imaging unit 7410 and a vehicle exterior information detector 7420 is connected to the vehicle exterior information detection unit 7400. The imaging unit 7410 includes at least one of a ToF (Time Of Flight) camera, a stereo camera, a monocular camera, an infrared camera, and other cameras. The vehicle exterior information detector 7420 includes at least one of, for example, an environmental sensor detecting present weather or atmospheric phenomena and a surrounding information detection sensor detecting other vehicles, obstacles, pedestrians, and the like around a vehicle on which the vehicle control system 7000 is mounted.

The environment sensor may be, for example, at least one of a raindrop sensor that detects rainy weather, a fog sensor that detects fog, a sunshine sensor that detects the degree of sunshine, and a snow sensor that detects snowfall. The surrounding information detection sensor may be at least one of an ultrasonic sensor, a radar device, and a LIDAR (Light Detection and Ranging or Laser Imaging Detection and Ranging) device. The imaging unit 7410 and the vehicle exterior information detector 7420 may be included as independent sensors or devices or may be included as a device in which a plurality of sensors or devices are integrated.

Figure 20:
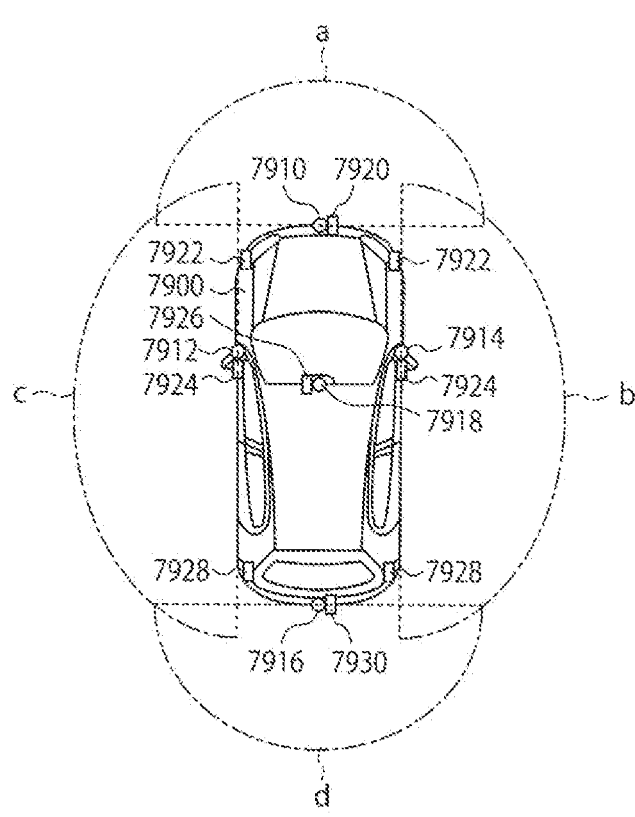
FIG. 20 is an explanatory diagram illustrating an example of positions at which a vehicle exterior information detection unit and an imaging unit are installed.

Here, FIG. 20 illustrates an example of installation positions of the imaging unit 7410 and the vehicle exterior information detector 7420. Imaging units 7910, 7912, 7914, 7916, and 7918 are provided, for example, at least one of a front nose, side mirrors, a rear bumper, a back door, and an upper portion of a windshield in a vehicle cabin of the vehicle 7900. The imaging unit 7910 included in the front nose and the imaging unit 7918 included in the upper portion of the windshield in the vehicle cabin mainly acquire an image in front of the vehicle 7900. The imaging units 7912 and 7914 included in the side mirrors mainly acquire images of the sides of the vehicle 7900. The imaging unit 7916 included in the rear bumper or the back door mainly acquires an image of the rear of the vehicle 7900. The imaging unit 7918 included in the upper portion of the windshield in the vehicle cabin is mainly used for detection of a preceding vehicle, a pedestrian, an obstacle, a traffic light, a traffic sign, a lane, or the like.

In FIG. 20, an example of shooting ranges of the respective imaging units 7910, 7912, 7914, and 7916 is illustrated. An imaging range a indicates an imaging range of the imaging unit 7910 provided, on the front nose, imaging ranges b and c indicate imaging ranges of the imaging units 7912 and 7914 provided on the side mirrors, and an imaging range d indicates an imaging range of the imaging unit 7916 provided on the rear bumper or the back door. For example, a bird's-eye view image of the vehicle 7900 as viewed from above can be obtained when the image data captured by the imaging units 7910, 7912, 7914, and 7916 are superimposed.

Vehicle exterior information detectors 7920, 7922, 7924, 7926, 7928, and 7930 provided in a front, a rear, a side, a corner, and an upper portion of the windshield in the vehicle cabin of the vehicle 7900 may be, for example, ultrasonic sensors or radar devices. The vehicle exterior information detectors 7920, 7926, and 7930 provided at the front nose, the rear bumper, the back door, and the upper portion of the windshield in the vehicle cabin of the vehicle 7900 may be, for example, LIDAR devices. These vehicle exterior information detectors 7920 to 7930 are mainly used for detection of a preceding vehicle, a pedestrian, an obstacle, or the like.

The description will be continued with reference to FIG. 19 again. The vehicle exterior information detection unit 7400 causes the imaging unit 7410 to capture an image of the outside of the vehicle and receives the captured image data. Further, the vehicle exterior information detection unit 7400 receives detection information from the connected vehicle exterior information detector 7420. When the vehicle exterior information detector 7420 is an ultrasonic sensor, a radar device, or a LIDAR device, the vehicle exterior information detection unit 7400 transmits ultrasonic waves, electromagnetic waves, or the like, and receives information on received reflected waves. The vehicle exterior information detection unit 7400 may perform object detection processing or distance detection processing for a person, a vehicle, an obstacle, a sign, a character on a road surface, or the like on the basis of the received information. The vehicle exterior information detection unit 7400 may perform environment recognition processing for recognizing rainfall, fog, road surface situation, and the like on the basis of the received information. The vehicle exterior information detection unit 7400 may calculate a distance to an object outside the vehicle on the basis of the received information.

Further, the vehicle exterior information detection unit 7400 may perform image recognition processing or distance detection processing for recognizing a person, a vehicle, an obstacle, a sign, a character on a road surface, or the like on the basis of the received image data. The vehicle exterior information detection unit 7400 may perform processing such as distortion correction or alignment on the received image data, and combine image data captured by the different imaging units 7410 to generate a bird's-eye view image or a panoramic image. The vehicle exterior information detection unit 7400 may perform viewpoint conversion processing using the image data captured by the different imaging units 7410.

The vehicle interior information detection unit 7500 detects information on the inside of the vehicle. For example, a driver state detector 7510 that detects a driver's state is connected to the vehicle interior information detection unit 7500. The driver state detector 7510 may include a camera that images a driver, a biological sensor that detects biological information of the driver, or a microphone that collects a sound in the vehicle cabin. The biological sensor is provided on, for example, a seat surface, a steering wheel, or the like and detects biological information of an occupant sitting on the seat or the driver holding the steering wheel. The vehicle interior information detection unit 7500 may calculate the degree of fatigue or the degree of concentration of the driver or determine whether the driver is drowsing based on detected information input from the driver state detector 7510. The vehicle interior information detection unit 7500 may perform a noise cancellation process or the like on a collected sound signal.

The integrated control unit 7600 controls overall operations within the vehicle control system 7000 according to various programs. An input unit 7800 is connected to the integrated control unit 7600. The input unit 7800 is realized by a device that can be input-operated by the passenger, such as a touch panel, buttons, a microphone, a switch, or a lever. The integrated control unit 7600 may be input with data obtained by recognizing voice input from a microphone. The input unit 7800 may be, for example, a remote control device using infrared rays or other radio waves, or may be an externally connected device such as a mobile phone or PDA (Personal Digital Assistant) corresponding to the operation of the vehicle control system 7000. The input unit 7800 may be, for example, a camera, and in this case, the passenger can input information by gesture. Alternatively, data obtained by detecting a motion of a wearable device worn by the passenger may be input. Further, the input unit 7800 may include, for example, an input control circuit that generates an input signal on the basis of information input by the passenger or the like using the input unit 7800 and outputs the input signal to the integrated, control unit 7600. The passenger or the like inputs various types of data to the vehicle control system 7000 or instructs a processing operation by operating the input unit 7800.

The storage unit 7690 may include a read only memory (ROM) that stores various programs that are executed by the microcomputer, and a random access memory (RAM) that stores various parameters, calculation results, sensor values, and the like. Also, the storage unit 7690 may be realized by a magnetic storage device such as an HDD (Hard Disc Drive), a semiconductor storage device, an optical storage device, a magneto-optical storage device, or the like.

The general-purpose communication I/F 7620 is a general-purpose communication I/F that mediates communication with various devices present in an external environment 7750. The general-purpose communication I/F 7620 may have, implemented therein, a cellular communication protocol such as GSM (registered trademark) (Global System of Mobile communications), WiMAX (registered trademark), LTE (registered trademark) (Long Term Evolution), or LTE-A (LTE-Advanced), or other wireless communication protocols such as wireless LAN (also referred to as Wi-Fi (registered trademark)) or Bluetooth (registered trademark). The general-purpose communication I/F 7620 may connect to, for example, a device (for example, an application server or a control server) present on an external network (for example, the Internet, a cloud network, or a business-specific network) via a base station or an access point. In addition, the general-purpose communication I/F 7620 uses, for example, P2P (Peer To Peer) technology to connect terminals (for example, terminals of drivers, pedestrians, stores, or MTC (Machine Type Communication) terminals) near the vehicle.

The dedicated communication I/F 7630 is a communication I/F that supports communication protocols developed for use in vehicles. The dedicated communication I/F 7630 may implement standard protocols such as WAVE (Wireless Access in Vehicle Environment), which is a combination of lower-layer IEEE802.11p and upper-layer IEEE1609, DSRC (Dedicated. Short Range Communications), or cellular communication protocol. The dedicated communication I/F 7630 typically perform V2X communication, which is a concept involving one or more of vehicle-to-vehicle communication, vehicle-to-infrastructure communication, vehicle-to-home communication, and vehicle-to-pedestrian communication.

The positioning unit 7640 receives, for example, a GNSS signal from a global navigation satellite system (GNSS) satellite (for example, a GPS signal from a global positioning system (GPS) satellite), executes positioning, and generates position information including a latitude, longitude, and altitude of the vehicle. The positioning unit 7640 may specify a current position by exchanging signals with a wireless access point, or may acquire position information from a terminal such as a mobile phone, PHS, or smartphone having a positioning function.

The beacon reception unit 7650 receives radio waves or electromagnetic waves transmitted from a radio station or the like installed on a road, and acquires information such as a current position, traffic Jam, no thoroughfare, or required time. A function of the beacon reception unit 7650 may be included, in the above-described dedicated communication I/F 7630.

The in-vehicle device I/F 7660 is a communication interface that mediates connections between the microcomputer 7610 and various in-vehicle devices 7760 present in the vehicle. The in-vehicle device I/F 7660 may establish a wireless connection using a wireless communication protocol such as wireless LAN, Bluetooth (registered trademark), NFC (Near Field Communication), or WUSB (Wireless USB). Furthermore, the in-vehicle device I/F 7660 may establish a wired connection such as a USB (Universal Serial Bus), HDMI (registered trademark) (High-Definition Multimedia Interface), or MHL (Mobile High-definition Link) via a connection terminal (not illustrated) (and a cable if necessary). The in-vehicle device 7760 may include, for example, at least one of a mobile device or wearable device of an occupant and an information device carried in or attached to the vehicle. Further, the in-vehicle device 7760 may include a navigation device that searches for a route to an arbitrary destination. The in-vehicle device I/F 7660 exchanges control signals or data signals with the in-vehicle devices 7760.

The in-vehicle network I/F 7680 is an interface that mediates communication between the microcomputer 7610 and the communication network 7010. The in-vehicle network I/F 7680 transmits and receives signals or the like in conformity with a predetermined protocol supported by the communication network 7010.

The microcomputer 7610 of the integrated control unit 7600 controls the vehicle control system 7000 according to various programs based on information acquired via at least one of the general-purpose communication I/F 7620, the dedicated communication I/F 7630, the positioning unit 7640, the beacon reception unit 7650, the in-vehicle device I/F 7660, and the in-vehicle network I/F 7680. For example, the microcomputer 7610 may calculate a control target value for a driving force generating device, a steering mechanism, or a braking device based on the acquired vehicle interior/exterior information, and output a control command to the drive system control unit 7100. For example, the microcomputer 7610 may perform coordinated control for the purpose of realizing the functions of ADAS (Advanced. Driver Assistance System), including vehicle collision avoidance or impact mitigation, following travel based on inter-vehicle distance, vehicle speed maintenance, vehicle collision warning, vehicle lane departure warning, and the like. The microcomputer 7610 may perform coordinated control to perform automatic driving or the like in which a vehicle travels autonomously regardless of an operation of a driver by controlling a driving force generation device, a steering mechanism, or a braking device, or the like based on acquired surrounding information of the vehicle.

The microcomputer 7610 may generate 3-dimensional distance information between the vehicle and objects such as surrounding structures or people based on information acquired via at least one of the general-purpose communication I/F 7620, the dedicated communication I/F 7630, the positioning unit 7640, the beacon reception unit 7650, the in-vehicle device I/F 7660, and the in-vehicle network I/F 7680 and may generate local map information including surrounding information of a present position of the vehicle. The microcomputer 7610 may predict a danger such as collision of the vehicle, approach of a pedestrian, or entry into a traffic prohibition road based on the acquired information and may generate a warning signal. The warning signal may be, for example, a signal for generating a warning sound or turning on a warning lamp.

The audio/image output unit 7670 transmits an output signal of at least one of audio and image to an output device that can visually or audibly notify information to a passenger of the vehicle or to the outside of the vehicle. In the example of FIG. 19, an audio speaker 7710, a display unit 7720, and an instrument panel 7730 are illustrated as output devices. The display unit 7720 may include, for example, at least one of an on-board display and a head-up display. The display unit 7720 may have an AR (Augmented Reality) display function. The output device may be not only such a device but also another device such as a headphone, a wearable device such as a glasses-type display worn by an occupant, a projector, or a lamp. When the output device is a display device, the display device visually displays results obtained through various processes performed by the microcomputer 7610 or information received from another control unit in various formats such as text, images, tables, and graphs. When the output device is a sound output device, the sound output device converts an audio signal formed by reproduced sound data, acoustic data, or the like into an analog signal and outputs the analog signal auditorily.

In the example illustrated in FIG. 19, at least two control units connected via the communication network 7010 may be integrated as one control unit. Alternatively, each control unit may be configured of a plurality of control units. Further, the vehicle control system 7000 may include another control unit (not illustrated). Further, in the above description, the other control unit may have some or all of functions of any one of the control units. That is, predetermined calculation processing may be performed by any one of the control units as long as information is transmitted and received via the communication network 7010. Similarly, a sensor or device connected to any one of the control units may be connected to the other control unit, and a plurality of control units may transmit or receive detection information to and from each other via the communication network 7010.

Note that any of the imaging devices of the first to seventh embodiments and their modifications can be used as the imaging unit 7410 shown in FIG. 19 or the imaging units 7910 to 7916 shown in FIG. 20.

Although the embodiments of the present disclosure have been described in detail with reference to the accompanying figures as described above, the technical scope of the present disclosure is not limited to such examples. It is apparent that those having ordinary knowledge in the technical field of the present disclosure could conceive various modified examples or changed examples within the scope of the technical ideas set forth in the claims. It should be understood that these also naturally fail within the technical scope of the present disclosure.

Further, the effects described in the present specification are merely explanatory or exemplary and are not intended as limiting. In other words, the technologies according to the present disclosure may exhibit other effects apparent to those skilled in the art from the description herein, in addition to or in place of the above effects.

Further, the following configurations also fall within the technical scope of the present disclosure.

(1) An imaging device including:

a photoelectric conversion layer disposed on a semiconductor substrate:

a transparent electrode layer disposed on the photoelectric conversion layer;

a first light-shielding portion that separates the photoelectric conversion layer into a plurality of pixels arranged in a first direction and a second direction that intersects the first direction, and is disposed along a boundary between the separated pixels; and a second light-shielding portion disposed along the boundary between the separated pixels inside the transparent electrode layer and disposed so that a portion of the boundary between adjacent pixels is interrupted.

(2) The imaging device according to (1), wherein the second light-shielding portion is disposed so that a portion of the boundary between the pixels arranged along the first direction in the transparent electrode layer is interrupted, and the pixels arranged along the second direction are separated from each other.

(3) The imaging device according to (1), wherein the second light-shielding portion is disposed so that a portion of the boundary between the pixels arranged along the first direction in the transparent electrode layer is interrupted, and a portion of the boundary between the pixels arranged along the second direction is interrupted.

(4) The imaging device according to any one of (1) to (3), further including:

a protective layer disposed on the transparent electrode layer, wherein the second light-shielding portion is disposed to penetrate the protective layer and the transparent electrode layer from an upper surface of the protective layer.

(5) The imaging device according to (4), further including:

a third light-shielding portion provided on the protective layer and connected to the second light-shielding portion, wherein the third light-shielding portion is disposed in a lattice pattern along the boundary between the pixels.

(6) The imaging device according to any one of (1) to (5), wherein the first light-shielding portion and the second light-shielding portion are separated in a stacking direction.

(7) The imaging device according to (6), further including:

a protective layer disposed on the transparent electrode layer, wherein the second light-shielding portion is disposed inside the transparent electrode layer so as to penetrate the protective layer from the upper surface of the protective layer and not penetrate the transparent electrode layer.

(8) The imaging device according to (7), further including:

a third light-shielding portion provided on the protective layer and connected to the second light-shielding portion, wherein the third light-shielding portion is disposed in a lattice pattern along the boundary between the pixels.

(9) The imaging device according to (7) or (8), further including:

a wiring stacked structure provided between the semiconductor substrate and the photoelectric conversion layer, wherein the first light-shielding portion is electrically connected to the wiring stacked structure.

(10) The imaging device according to (9), wherein the first light-shielding portion includes an electrode penetrating from the upper surface to the lower surface of the photoelectric conversion layer, and the electrode is electrically connected to the wiring stacked structure.

(11) The imaging device according to (6), wherein the first light-shielding portion is disposed to surround side portions of the pixels.

(12) The imaging device according to (6), wherein the second light-shielding portion is disposed to penetrate the transparent electrode layer, and side portions and end portions of the second light-shielding portion are covered with an insulating film.

(13) The imaging device according to (1), wherein the first light-shielding portion and the second light-shielding portion are connected in a stacking direction.

(14) The imaging device according to (13), further including:

a protective layer disposed on the transparent electrode layer, wherein the second light-shielding portion penetrates the protective layer and the transparent electrode layer from the upper surface of the protective layer and has side portions covered with an insulating film, the first light-shielding portion is disposed to penetrate the photoelectric conversion layer, and side portions and end portions of the second light-shielding portion are covered with an insulating film.

(15) The imaging device according to (14), wherein a cross-sectional area of the end portions of the first light-shielding portion is smaller than a cross-sectional area of other portions.

(16) The imaging device according to (14), wherein a cross-sectional area of the end portions of the first light-shielding portion is larger than a cross-sectional area of other portions.

(17) The imaging device according to (13), further including:

a third light-shielding portion provided on the protective layer, wherein the third light-shielding portion is connected to the second light-shielding portion.

(18) The imaging device according to any one of (1) to (17), wherein the first light-shielding portion and the second light-shielding portion are disposed so as to at least partially overlap when viewed in a plan view.

(19) The imaging device according to any one of (1) to (18), further including:

a first wiring that supplies a ground potential to the transparent electrode layer; and a second wiring that supplies a negative bias potential to the second light-shielding portion.

(20) An electronic apparatus including:

an imaging device; and a signal processing unit that performs signal processing based on pixel signals captured by the imaging device, wherein the imaging device includes:

a photoelectric conversion layer disposed on a semiconductor substrate;

a transparent electrode layer disposed on the photoelectric conversion layer;

a first light-shielding portion that separates the photoelectric conversion layer into a plurality of pixels arranged in a first direction and a second direction that intersects the first direction, and is disposed along a boundary between the separated pixels; and a second light-shielding portion disposed along the boundary between the separated pixels inside the transparent electrode layer and disposed so that a portion of the boundary between adjacent pixels is interrupted.

(21) The imaging device according to (1), wherein the second light-shielding portion includes:

a first portion and a second portion extending and facing each other in the first direction when viewed from the upper surface side of the transparent electrode layer; and a third portion and a fourth portion extending and facing each other in the second direction, the first to fourth portions correspond to sides of a substantially rectangular shape surrounding the partitioned pixels, and portions corresponding to sides forming at least two corners of the substantially rectangular shape are not connected.

(22) The imaging device according to (21), wherein portions corresponding to sides forming respective corners of the substantially rectangular shape are not connected.

(23) The imaging device according to (22), wherein the third portion and the fourth portion each are disposed in a region between the first portion and the second portion.

(24) The imaging device according to (22), wherein the first portion has a first end and a second end disposed in the first direction, the second portion has a third end and a fourth end disposed in the first direction, the third portion has a fifth end and a sixth end disposed in the second direction, the fourth portion has a seventh end and an eighth end disposed in the second direction, a portion from a portion of the first portion to the second end constitutes a side of the substantially rectangular shape, a portion from a portion of the second portion to the fourth end constitutes a side of the substantially rectangular shape, a portion from a portion of the third portion to the sixth end constitutes a side of the substantially rectangular shape, a portion from a portion of the fourth portion to the eighth end constitutes a side of the substantially rectangular shape, a direction from the first end of the first portion to the second end is located between the fifth end and the sixth end of the third portion and the second end is not connected to the third portion, a direction from the third end of the second portion to the fourth end is located between the seventh end and the eighth end of the fourth portion and the fourth end is not connected to the fourth portion, a direction from the fifth end of the third portion to the sixth end is located between the third end and the fourth end of the second portion and the sixth end is not connected to the second portion, and a direction from the seventh end of the fourth portion to the eighth end is located between the first end and the second end of the first portion and the eighth end is not connected to the first portion.

(25) The imaging device according to (22), wherein

The second light-shielding portion further includes fifth to eighth portions, the fifth portion is disposed at a corner formed by the first portion and the third portion, the sixth portion is disposed at a corner formed by the third portion and the second portion, the seventh portion is disposed at a corner formed by the second portion and the fourth portion, and the eighth portion is disposed at a corner formed by the fourth portion and the first portion.

(26) The imaging device according to (22), wherein the second light-shielding portion further includes fifth to eighth portions, the fifth portion is disposed inside the pixel corresponding to a corner formed by the first portion and the third portion, the sixth portion is disposed inside the pixel corresponding to a corner formed by the third portion and the third portion, the seventh portion is disposed inside the pixel corresponding to a corner formed by the second portion and the fourth portion, the eighth portion is disposed inside the pixel corresponding to a corner formed by the fourth portion and the first portion.

(27) The imaging device according to (21), wherein the first portion is connected to the fourth portion but is not connected to the third portion, and the second portion is connected to the third portion but is not connected to the fourth portion.

REFERENCE SIGNS LIST

10 Semiconductor substrate

20 Wiring stacked structure

22 Insulating film
24 Wiring layer
30 Buffer layer
40 Photoelectric conversion layer
50 Buffer Layer
60 Transparent electrode layer
70 Protective layer
80 Light-shielding member
81 Insulating film
82 Insulating film
83 Insulating film
84 Light-shielding member
86 Light-shielding member
90 Light-shielding member
100 Mask
102, 104 Opening
106 Mask
107 Opening
110 Metal film
200 Pixel array
210, 220 Terminal
230, 240 Wiring
250 Insulating film
252, 254 Opening
7000 Vehicle control system
7010 Communication Network
7100 Drive system control unit
7110 Vehicle status detector
7200 Body system control unit
7300 Battery control unit
7310 Secondary battery
7400 Outside the vehicle Information detection unit
7410 Imaging unit
7420 Vehicle exterior information detector
7500 Vehicle interior information detection unit
7510 Driver state detector
7600 Integrated control unit
7610 Microcomputer
7620 General purpose communication I/F
7630 Dedicated communication I/F
7640 Positioning unit
7650 Beacon reception unit
7660 In-vehicle device I/F
7670 Audio/image output unit
7680 in-vehicle network I/F
7690 Storage unit
7710 Audio speaker
7720 Display unit
7730 Instrument panel
7750—External environment
7760 In-vehicle device
7800 Input unit
7900 Vehicle
7910 to 7916 Imaging unit
7920 to 7930 Vehicle exterior information detector

The invention claimed is:

1. An imaging device comprising:

a photoelectric conversion layer disposed on a semiconductor substrate;

a transparent electrode layer disposed on the photoelectric conversion layer;

a first light-shielding portion that separates the photoelectric conversion layer into a plurality of pixels arranged in a first direction and a second direction that intersects the first direction, and is disposed along a boundary between the separated pixels; and a second light-shielding portion disposed along the boundary between the separated pixels inside the transparent electrode layer and disposed so that a portion of the boundary between adjacent pixels is interrupted.

2. The imaging device according to claim 1, wherein the second light-shielding portion is disposed so that a portion of the boundary between the pixels arranged along the first direction in the transparent electrode layer is interrupted, and the pixels arranged along the second direction are separated from each other.

3. The imaging device according to claim 1, wherein the second light-shielding portion is disposed so that a portion of the boundary between the pixels arranged along the first direction in the transparent electrode layer is interrupted, and a portion of the boundary between the pixels arranged along the second direction is interrupted.

4. The imaging device according to claim 1, further comprising:

a protective layer disposed on the transparent electrode layer, wherein the second light-shielding portion is disposed to penetrate the protective layer and the transparent electrode layer from an upper surface of the protective layer.

5. The imaging device according to claim 4, further comprising:

a third light-shielding portion provided on the protective layer and connected to the second light-shielding portion, wherein the third light-shielding portion is disposed in a lattice pattern along the boundary between the pixels.

6. The imaging device according to claim 1, wherein the first light-shielding portion and the second light-shielding portion are separated in a stacking direction.

7. The imaging device according to claim 6, further comprising:

a protective layer disposed on the transparent electrode layer, wherein the second light-shielding portion is disposed inside the transparent electrode layer so as to penetrate the protective layer from an upper surface of the protective layer and not penetrate the transparent electrode layer.

8. The imaging device according to claim 7, further comprising:

a third light-shielding portion provided on the protective layer and connected to the second light-shielding portion, wherein the third light-shielding portion is disposed in a lattice pattern along the boundary between the pixels.

9. The imaging device according to claim 7, further comprising:

a wiring stacked structure provided, between the semiconductor substrate and the photoelectric conversion layer, wherein the first light-shielding portion is electrically connected to the wiring stacked structure.

10. The imaging device according to claim 9, wherein the first light-shielding portion includes an electrode penetrating from the upper surface to a lower surface of the photoelectric conversion layer, and the electrode is electrically connected to the wiring stacked structure.

11. The imaging device according to claim 6, wherein the first light-shielding portion is disposed to surround side portions of the pixels.

12. The imaging device according to claim 6, wherein
the second light-shielding portion is disposed to penetrate the transparent electrode layer, and side portions and end portions of the second light-shielding portion are covered with an insulating film.

13. The imaging device according to claim 1, wherein
the first light-shielding portion and the second light-shielding portion are connected in a stacking direction.

14. The imaging device according to claim 13, further comprising:
a protective layer disposed on the transparent electrode layer, wherein
the second light-shielding portion penetrates the protective layer and the transparent electrode layer from an upper surface of the protective layer and has side portions covered with an insulating film,
the first light-shielding portion is disposed to penetrate the photoelectric conversion layer, and
side portions and end portions of the second light-shielding portion are covered with an insulating film.

15. The imaging device according to claim 14, wherein
a cross-sectional area of the end portions of the first light-shielding portion is smaller than a cross-sectional area of other portions.

16. The imaging device according to claim 14, wherein
a cross-sectional area of the end portions of the first light-shielding portion is larger than a cross-sectional area of other portions.

17. The imaging device according to claim 13, further comprising:
a protective layer disposed on the transparent electrode layer; and
a third light-shielding portion provided, on the protective layer and connected to the second light-shielding portion.

18. The imaging device according to claim 1, wherein
the first light-shielding portion and the second light-shielding portion are disposed so as to at least partially overlap when viewed in a plan view.

19. The imaging device according to claim 1, further comprising:
a first wiring that supplies a ground potential to the transparent electrode layer; and
a second wiring that supplies a negative bias potential to the second light-shielding portion.

20. An electronic apparatus comprising:
an imaging device; and
a signal processing unit that performs signal processing based on pixel signals captured by the imaging device,
wherein the imaging device includes:
a photoelectric conversion layer disposed on a semiconductor substrate;
a transparent electrode layer disposed on the photoelectric conversion layer;
a first light-shielding portion that separates the photoelectric conversion layer into a plurality of pixels arranged in a first direction and a second direction that intersects the first direction, and is disposed along a boundary between the separated pixels; and
a second light-shielding portion disposed along the boundary between the separated pixels inside the transparent electrode layer and disposed so that a portion of the boundary between adjacent pixels is interrupted.

* * * * *